(12) United States Patent
Colon et al.

(10) Patent No.: US 9,569,569 B1
(45) Date of Patent: Feb. 14, 2017

(54) DATA STORAGE SYSTEM MODELING

(75) Inventors: Julio A. Colon, Northbridge, MA (US);
Dan Aharoni, Brookline, MA (US);
Hagay Dagan, Framingham, MA (US);
Richard F. Otte, Poughkeepsie, NY (US); Marvin F. Miller, White Lake, MI (US); Iliès Idrissi, Allston, MA (US); Gil Ratsaby, Boston, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 591 days.

(21) Appl. No.: 13/525,492

(22) Filed: Jun. 18, 2012

(51) Int. Cl.
*G06F 9/44* (2006.01)
*G06F 17/50* (2006.01)

(52) U.S. Cl.
CPC ................. *G06F 17/5022* (2013.01)

(58) Field of Classification Search
CPC   G06F 11/3442; G06F 3/0653; G06F 11/3457; G06F 3/0629; G06F 3/067; G06F 11/0757; G06F 11/076; G06F 3/0665; G06F 3/0683; G06F 17/30067; G06F 17/5022
USPC ....... 703/2, 21; 709/223, 224; 711/114, 162, 711/165
See application file for complete search history.

(56) References Cited

U.S. PATENT DOCUMENTS

| | | | |
|---|---|---|---|
| 5,544,347 A | 8/1996 | Yanai et al. | |
| 5,742,792 A | 4/1998 | Yanai et al. | |
| 7,292,969 B1 * | 11/2007 | Aharoni et al. | ................. 703/21 |
| 7,392,360 B1 | 6/2008 | Aharoni et al. | |
| 7,469,326 B1 * | 12/2008 | Hardman | ....................... 711/162 |
| 7,640,342 B1 | 12/2009 | Aharoni et al. | |
| 7,949,637 B1 | 5/2011 | Burke | |
| 8,224,630 B2 | 7/2012 | Das et al. | |
| 8,433,848 B1 * | 4/2013 | Naamad | ................ G06F 3/0605 711/114 |
| 8,467,281 B1 | 6/2013 | Colon et al. | |

(Continued)

OTHER PUBLICATIONS

Apicella (Test Center Review: BlueArc Titan 3200 is a giant among NAS systems, InfoWorld, Aug. 18, 2008. http://www.infoworld.com/article/2652937/infrastructure-storage/test-center-review--blue . . . ).*

(Continued)

*Primary Examiner* — Kamini S Shah
*Assistant Examiner* — Scott S Cook
(74) *Attorney, Agent, or Firm* — Muirhead and Saturnelli, LLC

(57) ABSTRACT

A target data storage system is simulated. A source configuration is received. First activity data is received representing workload for the source configuration. A target data storage system configuration for one or more target data storage systems is created. The target data storage system configuration is modeled including determining a simulated workload for components of the target data storage system configuration based on the first activity data. A utilization map is displayed in a user interface indicating component level utilizations of components of the target data storage system configuration based on the simulated workload. A data movement optimization for the target data storage system configuration is simulated. A second utilization map is displayed indicating updated component level utilizations for the target data storage system configuration which have been revised to model the simulated data movement optimization for the target data storage system configuration.

21 Claims, 24 Drawing Sheets

(56) References Cited

U.S. PATENT DOCUMENTS

| | | | |
|---|---|---|---|
| 8,532,973 B1* | 9/2013 | CaraDonna et al. | 703/21 |
| 8,566,553 B1* | 10/2013 | Marshak et al. | 711/170 |
| 8,843,459 B1* | 9/2014 | Aston et al. | 707/694 |
| 2004/0172506 A1 | 9/2004 | Gotoh et al. | |
| 2008/0201542 A1* | 8/2008 | Maruyama | G06F 3/0607 711/165 |
| 2009/0070541 A1 | 3/2009 | Yochai | |
| 2011/0010514 A1* | 1/2011 | Benhase et al. | 711/162 |
| 2012/0166725 A1* | 6/2012 | Soran et al. | 711/114 |
| 2012/0221521 A1* | 8/2012 | Chiu | G06F 11/3485 707/622 |
| 2013/0124798 A1* | 5/2013 | Aszmann et al. | 711/114 |
| 2013/0265825 A1* | 10/2013 | Lassa | G06F 3/0619 365/185.11 |
| 2013/0312005 A1* | 11/2013 | Chiu | G06F 3/061 718/105 |

OTHER PUBLICATIONS

Colon, Julio A., "Techniques for Identifying Devices Having Slow Response Times", U.S. Appl. No. 12/807,943, filed Sep. 17, 2010.
U.S. Appl. No. 10/786,995, filed Feb. 25, 2004 for "System and Method for Simulating Performance of One or More Data Storage Systems With Utilization Input".

* cited by examiner

DATA STORAGE SYSTEM MODELING

BACKGROUND

Technical Field

This application generally relates to data storage, and more particularly to techniques used in connection with modeling or simulating a data storage system.

Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. Such storage devices and data storage systems are provided, for example, by EMC Corporation of Hopkinton, Mass. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical disk units, logical devices or logical volumes. The logical disk units may or may not correspond to the actual physical disk drives. Allowing multiple host systems to access the single storage device unit allows the host systems to share data stored therein.

Design objectives for data storage systems include cost, performance, and availability. Objectives typically include are a low cost per megabyte, a high I/O performance and low response time (RT), and high data availability. Availability is measured by the ability to access data. Often such data availability is provided by use of redundancy using well-known techniques such as mirroring, RAID protection and remote replication.

One problem encountered in the implementation of data storage systems concerns optimizing the storage capacity while maintaining the desired availability and reliability of the data through redundancy. It is important to allocate as closely as possible the right amount of storage capacity with going over or under significantly because of cost and necessity but this is a complex task. It has required great deal of skill and knowledge about computers, software applications such as databases, and the very specialized field of data storage. Such requisite abilities have long been expensive and difficult to access. There remains and probably will be an increasing demand for and corresponding scarcity of such skilled people.

Determining the size and number of disk array or other data storage system needed by a customer requires information about both space, traffic and a desired quality of service. It is not sufficient to size a solution simply based on the perceived quantity of capacity desired, such as the number of terabytes believed to be adequate. In addition to general capacity planning problems with data storage systems other complexities may arise. One such complexity arise when there is an interest in merging existing data storage systems with newer or fewer data storage systems. Such consolidation helps a customer reduce operating costs by decreasing the number of storage systems, and migrating the data to fewer and/or newer, larger capacity, more efficient storage systems. Consolidation may be of interest for some of the following reasons: saving footprint space; reducing the cost of utilities; simplifying management and reducing management costs; reducing hardware inventory costs; and upgrading to new technology. On the other hand there are costs associated with such a change and there is need for a simple tool to allow for the analysis of such a change and to determine an optimum solution, and in particular with regard to performance requirements and desired characteristics.

There is a long-felt need for a computer-based tool that would allow a straight-forward non-complex way to allocate proper storage capacity while balancing cost, growth plans, workload, and performance requirements and further if such a tool would be useful for analyzing consolidation or merging operations along with simulation or modeling of different aspects of a data storage system.

SUMMARY OF THE INVENTION

In accordance with one aspect of the invention is a method of simulating a target data storage system comprising: receiving a source configuration; receiving first activity data representing workload for the source configuration; creating a target data storage system configuration for one or more target data storage systems; modeling the target data storage system configuration, said modeling including determining a simulated workload for components of the target data storage system configuration based on the first activity data; displaying, in a user interface, a utilization map indicating component level utilizations of components of the target data storage system configuration based on the simulated workload; simulating a data movement optimization for the target data storage system configuration; and displaying, in the user interface, a second utilization map indicating updated component level utilizations of the components of the target data storage system configuration which have been revised to model the data movement optimization simulated for the target data storage system configuration. Each of the utilization map and the second utilization map may provide a visual indication in terms of percentage of utilization for each of the components. The components may include at least one front end component port, at least one front end component processor, at least one front end component board, at least one back end component port, at least one back end component processor, at least one back end component board, at least one portion of cache, and a plurality of physical storage devices. The source configuration may include configuration information for one or more source data storage systems including a plurality of logical devices. Creating the target data storage system configuration may include mapping each of said plurality of logical devices to one or more physical storage devices. The mapping may include mapping each logical device to any of: one of a plurality of target storage tiers of physical storage devices and a target pool of physical storage devices belonging to one of the plurality of target storage tiers. The plurality of target storage tiers may include a first storage tier and a second storage tier. The first storage tier may include physical storage devices having a first performance classification based on a first set of performance characteristics and being of a first drive technology. The second storage tier may include physical storage devices having a second performance classification based on a second set of performance characteristics and being of a second drive technology different from the first. The first performance classification may denote a higher performance classification than the second performance classification. The mapping may be performed automatically in accordance with one or more criteria including any of a workload of said each logical volume, a size of each logical volume, data protection specified for each logical volume, and capacity of the one or more physical storage devices to which each logical volume is mapped. The method may further include viewing information regarding performance of a portion of said plurality of logical volumes; selecting a least a first of said portion of logical volumes; and manually mapping at least the first logical volume to any of a first of the plurality of target storage tiers of physical storage devices and said target pool. The method may also include viewing information indicating which of the plurality of logical volumes are mapped to any of: one of the plurality of storage tiers and the target pool as a result of automatically performing the mapping. Simulating the data movement optimization may include simulating a promotion of a first data portion of one of the plurality of logical devices, wherein the first data portion may be moved from a first physical storage device of the second storage tier to a second physical storage device of the first storage tier. Simulating the data movement optimization may include simulating a demotion of a first data portion of one of the plurality of logical devices, where the first data portion may be moved from a first physical storage device of the first storage tier to a second physical storage device of the second storage tier. The one logical device may be a virtually provisioned device having an associated logical address range and physical storage may not be allocated for at least a portion of said associated logical address range. A total amount of usable storage capacity may be specified. Creating the target data storage system configuration may include automatically selecting a RAID protection level and determining a number of physical storage devices needed to provide the total amount with the selected RAID protection level. Creating the target data storage system may include automatically determining a percentage of the total amount of usable storage capacity for each of a plurality of storage tiers including physical storage devices of one of a plurality of performance classifications. Creating the target data storage system configuration may include manually specifying any of a RAID protection level, a percentage of a total amount of usable storage capacity for each of a plurality of storage tiers including physical storage devices of one of a plurality of performance classifications, and a number of physical storage devices for any of a storage tier and target pool. The first activity data may include any of response time, I/O throughput per unit of time, percentage or number of read operations processed in a time period, percentage or number of write operations processed in a time period, read hits, and read misses. The first activity data includes activity data may include any of: observed activity data based on actual data storage system performance in connection with servicing I/O operations, activity data obtained through simulation, estimated activity data, and second activity data indirectly obtained as a result of translating an initial set of activity data into the second activity data.

In accordance with another aspect of the invention is a computer readable medium comprising code store thereon for simulating a target data storage system, the computer readable medium comprising code for: receiving a source configuration; receiving first activity data representing workload for the source configuration; creating a target data storage system configuration for one or more target data storage systems; modeling the target data storage system configuration, said modeling including determining a simulated workload for components of the target data storage system configuration based on the first activity data; displaying, in a user interface, a utilization map indicating component level utilizations of components of the target data storage system configuration based on the simulated workload; simulating a data movement optimization for the target data storage system configuration; and displaying, in the user interface, a second utilization map indicating updated component level utilizations of the components of the target data storage system configuration which have been revised to model the data movement optimization simulated for the target data storage system configuration. Each of the utilization map and the second utilization map may provide a visual indication in terms of percentage of utilization for each of said components. The components may include at least one front end component port, at least one front end component processor, at least one front end component board, at least one back end component port, at least one back end component processor, at least one back end component board, at least one portion of cache, and a plurality of physical storage devices.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
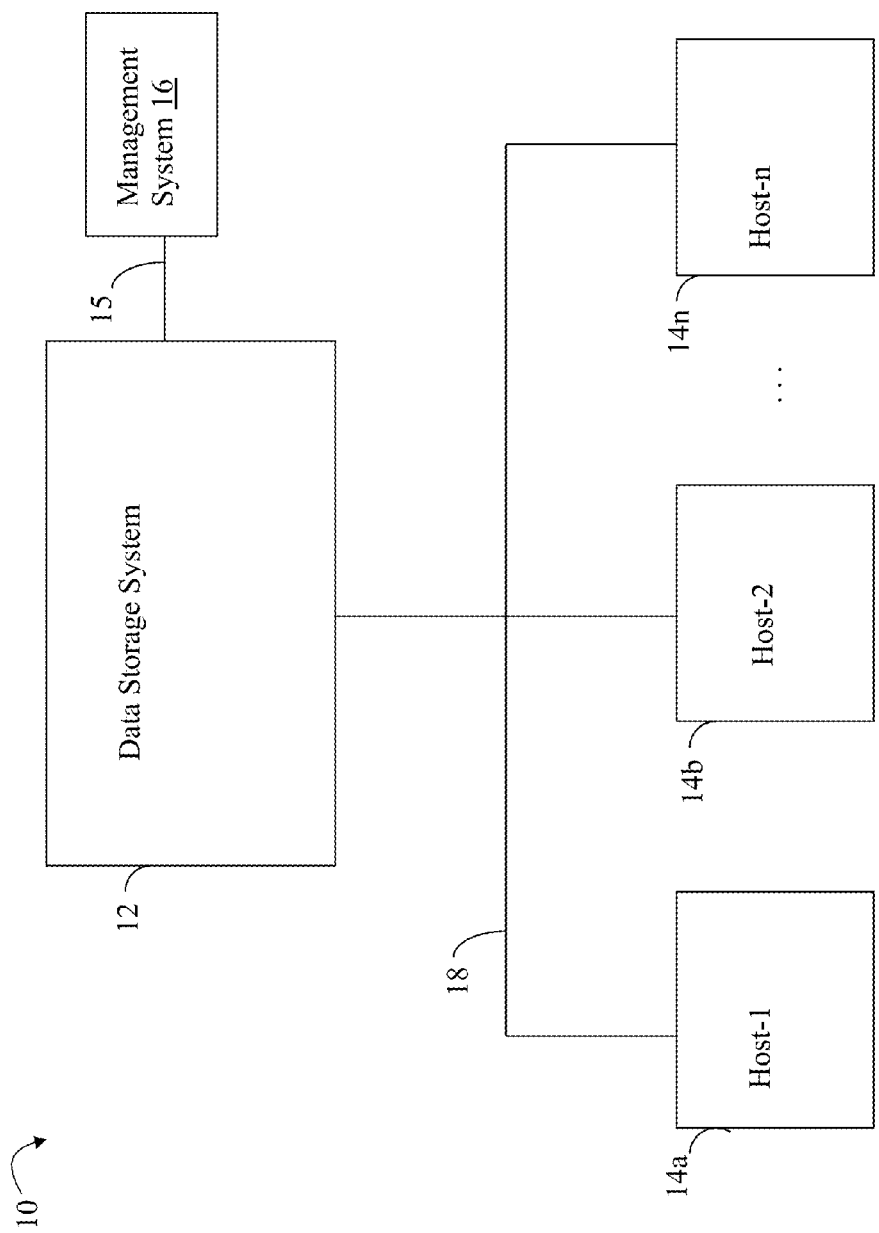
FIG. 1 is an example of an embodiment of a computer system that may utilize the techniques described herein.

Referring to FIG. 1, shown is an example of an embodiment of a system that may be used in performing the techniques described herein. The system 10 includes a data storage system 12, such as a data storage array, connected to host systems 14a-14n through communication medium 18. The data storage system 12 is also connected to management system 16 through communication medium 15. In this embodiment of the system 10, the N hosts 14a-14n may access the data storage system 12, for example, in performing input/output (I/O) operations or data requests. The communication mediums 15, 18 may be any one or more of a variety of networks or other type of communication connections as known to those skilled in the art. Each of the communication mediums 15, 18 may be a network connection, bus, and/or other type of data link, such as a hardwire or other connections known in the art. For example, the communication mediums 15, 18 may be the Internet, an intranet, network or other wireless or other hardwired connection(s) by which the data storage system 12 communicates with other components such as host systems 14a-14n and the management system 16.

Each of the host systems 14a-14n and the data storage system 12 included in the system 10 may be connected to the communication medium 18 by any one of a variety of connections as may be provided and supported in accordance with the type of communication medium 18. Similarly, the data storage system 12 and management system 16 are also connected to the communication medium 15. The processors included in the host computer systems 14a-14n and management system 16 may be any one of a variety of proprietary or commercially available single or multi-processor system, such as an Intel-based processor, or other type of commercially available processor able to support traffic in accordance with each particular embodiment and application.

It should be noted that the particulars of the hardware and software included in each of the components that may be included in the data storage system 12 are described herein in more detail, and may vary with each particular embodiment. Each of the host computers 14a-14n, management system 16, and data storage system 12 may all be located at the same physical site, or, alternatively, may also be located in different physical locations. Examples of the communication medium that may be used to provide the different types of connections between the host computer systems and the data storage system of the system 10 may use a variety of different communication protocols such as TCP/IP, Ficon, SCSI, Fibre Channel, or iSCSI, and the like. Some or all of the connections by which the hosts and data storage system 12 may be connected to the communication medium 18 may pass through other communication devices, such as switching equipment that may exist, a phone line, a repeater, a multiplexer or even a satellite.

Each of the host computer systems may perform different types of data operations in accordance with different types of administrative tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12. It should be noted that the data storage system 12 of FIG. 1 may physically be a single data storage system, such as a single data storage array sold under the trademark Symmetrix™ data storage system, VMAX™ data storage system or VNX™ data storage system by EMC Corporation, as well one or more other data storage systems as may vary with embodiment. For example, in an embodiment using multiple data storage systems, such as multiple data storage arrays, such data storage systems may be connected to one another and may use techniques such as RDF (Remote Data Facility) by EMC Corporation. In some instances, it may be desirable to copy data from one storage system to another. For example, if a host writes data to a first storage device, it may be desirable to copy that data to a second storage device provided in a different location so that if a disaster occurs that renders the first storage device inoperable, the host (or another host) may resume operation using the data of the second storage device. Such a capability is provided, for example, by the Remote Data Facility (RDF) product provided by EMC Corporation of Hopkinton, Mass. Data storage device communication between data storage systems sold under the trademark Symmetrix™ data storage systems using RDF is described, for example, in U.S. Pat. Nos. 5,742,792 and 5,544,347, both of which are incorporated by reference herein. With RDF, a user may denote a first storage device as a master storage device and a second storage device as a slave storage device. Other incarnations of RDF may provide a peer to peer relationship between the local and remote storage devices. The host interacts directly with the local storage device, but any data changes made to the local storage device are automatically provided to a remote storage device using RDF. The local and remote storage devices may be connected by a data link, such as an ESCON link or a Fiber Channel link. The RDF functionality may be facilitated with an RDF adapter (RA) provided at each of the storage devices.

The management system 16 may be used in connection with facilitating collection and analysis of data regarding performance of the data storage system 12 as well as possibly other components. The management system 16 may include code stored and executed thereon to perform processing of the data collected. The particular data collected as well as the processing that may be performed in connection with analysis of the collected data are described in more detail in following paragraphs. The management system 16 may include any one or more different forms of computer-readable media known in the art upon which the code used in connection with the techniques herein is stored. Computer-readable media may include different forms of volatile (e.g., RAM) and non-volatile (e.g., ROM, flash memory, magnetic or optical disks, or tape) storage which may be removable or non-removable.

Figure 2A:
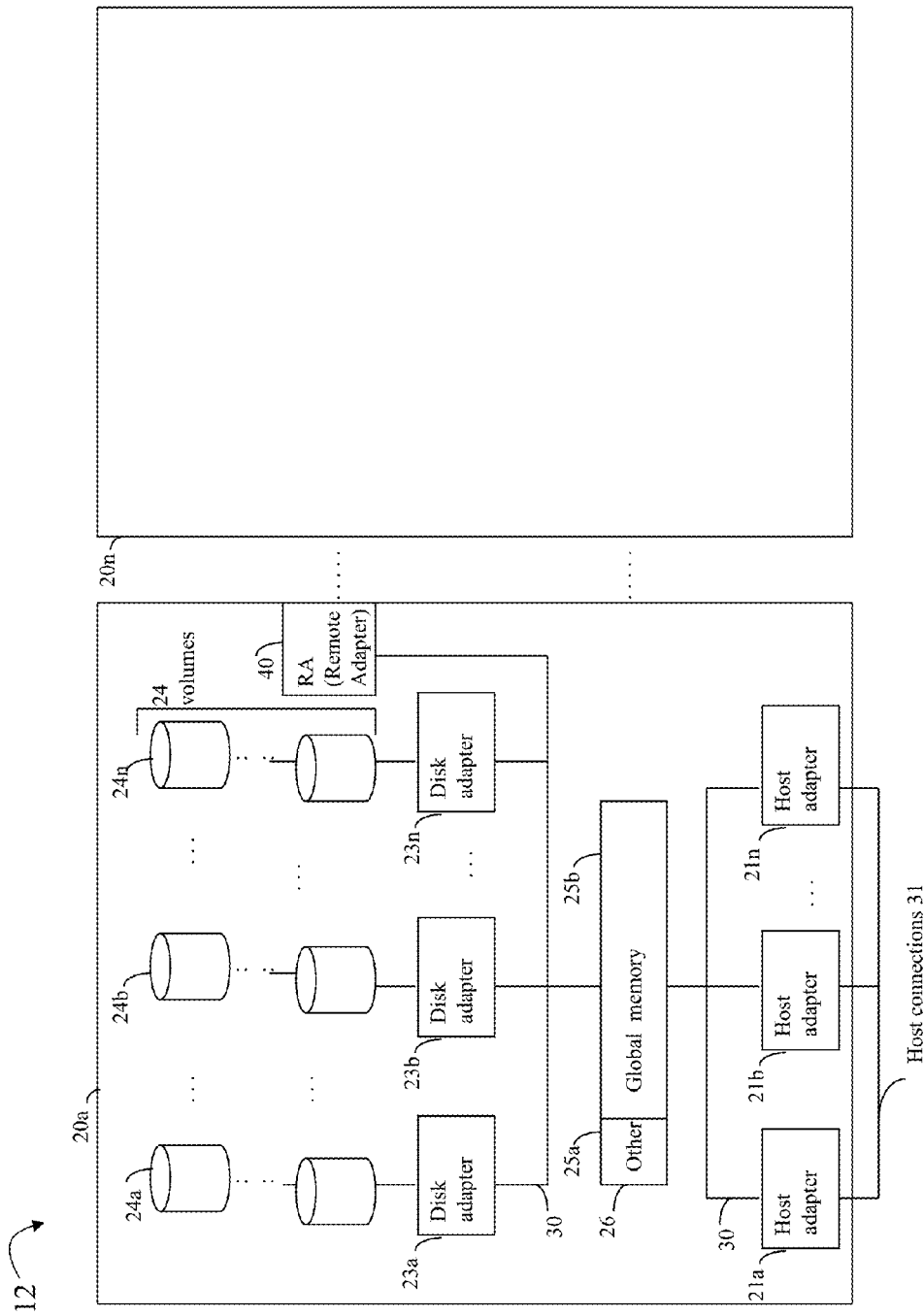
FIG. 2A is an example of an embodiment of a data storage system.

Referring to FIG. 2A, shown is an example of an embodiment of the data storage system 12 that may be included in the system 10 of FIG. 1. Included in the data storage system 12 of FIG. 2A are one or more data storage systems 20a-20n as may be manufactured by one or more different vendors. Each of the data storage systems 20a-20n may be interconnected (not shown). Additionally, the data storage systems may also be connected to the host systems through any one or more communication connections 31 that may vary with each particular embodiment and device in accordance with the different protocols used in a particular embodiment. The type of communication connection used may vary with certain system parameters and requirements, such as those related to bandwidth and throughput required in accordance with a rate of I/O requests as may be issued by the host computer systems, for example, to the data storage system 12. In this example as described in more detail in following paragraphs, reference is made to the more detailed view of element 20a. It should be noted that a similar more detailed description may also apply to any one or more of the other elements, such as 20n, but have been omitted for simplicity of explanation. It should also be noted that an embodiment may include data storage systems from one or more vendors. Each of 20a-20n may be resources included in an embodiment of the system 10 of FIG. 1 to provide storage services to, for example, host computer systems. It should be noted that the data storage system 12 may operate stand-alone, or may also included as part of a storage area network (SAN) that includes, for example, other components.

Each of the data storage systems, such as 20*a*, may include a plurality of disk devices or volumes, such as the arrangement 24 consisting of n rows of disks or volumes 24*a*-24*n*. In this arrangement, each row of disks or volumes may be connected to a disk adapter ("DA") or director responsible for the backend management of operations to and from a portion of the disks or volumes 24. In the system 20*a*, a single DA, such as 23*a*, may be responsible for the management of a row of disks or volumes, such as row 24*a*. In a data storage system such as by EMC Corporation, a backend DA may also be referred to as a disk controller. The DA may performed operations such as reading data from, and writing data to, the physical devices which are serviced by the DA.

The system 20*a* may also include one or more host adapters ("HAs") or directors 21*a*-21*n*. Each of these HAs may be used to manage communications and data operations between one or more host systems and the global memory. In an embodiment, the HA may be a Fibre Channel or other front end adapter (FA) which facilitates host communication. Generally, directors may also be characterized as the different adapters, such as HAs (including FAs), DAs RAs and the like, as described herein. Components of the data storage system, such as an HA, which may communicate with a host may also be referred to as front end components. A component of the data storage system which communicates with a front end component, such as a DA, may be characterized as a backend component. In connection with data storage systems such as by EMC Corporation, various types of directors or adapters may be implemented as a processor, or, more generally, a component that includes the processor. Examples of directors are disk adapters (DAs), host adapters (HAs) and the like.

One or more internal logical communication paths may exist between the DAs, the RAs, the HAs, and the memory 26. An embodiment, for example, may use one or more internal busses, fabric, and/or communication modules. For example, the global memory portion 25*b* may be used to facilitate data transfers and other communications between the DAs, HAs and RAs in a data storage system. In one embodiment, the DAs 23*a*-23*n* may perform data operations using a cache that may be included in the global memory 25*b*, for example, in communications with other disk adapters or directors, and other components of the system 20*a*. The other portion 25*a* is that portion of memory that may be used in connection with other designations that may vary in accordance with each embodiment.

The particular data storage system as described in this embodiment, or a particular device thereof, such as a disk, should not be construed as a limitation. For example, an embodiment in accordance with techniques herein may include multiple storage tiers of solid state storage (SSD) devices, such as flash drives, as well as one or more other storage tiers comprising one or more types of rotating disks. Other types of commercially available data storage systems, as well as processors and hardware controlling access to these particular devices, may also be included in an embodiment.

Also shown in the storage system 20*a* is an RA or remote adapter 40. The RA may be hardware including a processor used to facilitate communication between data storage systems, such as between two of the same or different types of data storage systems.

Host systems provide data and access control information through channels to the storage systems, and the storage systems may also provide data to the host systems also through the channels. The host systems do not address the disk drives of the storage systems directly, but rather access to data may be provided to one or more host systems from what the host systems view as a plurality of logical devices or logical volumes (LVs). The LVs may or may not correspond to the actual or physical disk drives. For example, one or more LVs may reside on a single physical disk drive. A single LV may also reside on multiple physical drives, for example depending on the RAID protection and layout. Data in a single storage system may be accessed by multiple hosts allowing the hosts to share the data residing therein. The HAs may be used in connection with communications between a data storage system and a host system. The RAs may be used in facilitating communications between two data storage systems. The DAs may be used in connection with facilitating communications to the associated disk drive(s) and LV(s) residing thereon. A LUN or logical unit number may be characterized as a disk array or data storage system reference to an amount of disk space that has been formatted and allocated for use to one or more hosts. An LV may further map, for example, to a single LUN, more than one LUN, and/or a portion of a LUN.

The DA performs I/O operations on a disk drive. Data residing on an LV may be accessed by the DA following a data request in connection with I/O operations that other directors originate.

Figure 2B:
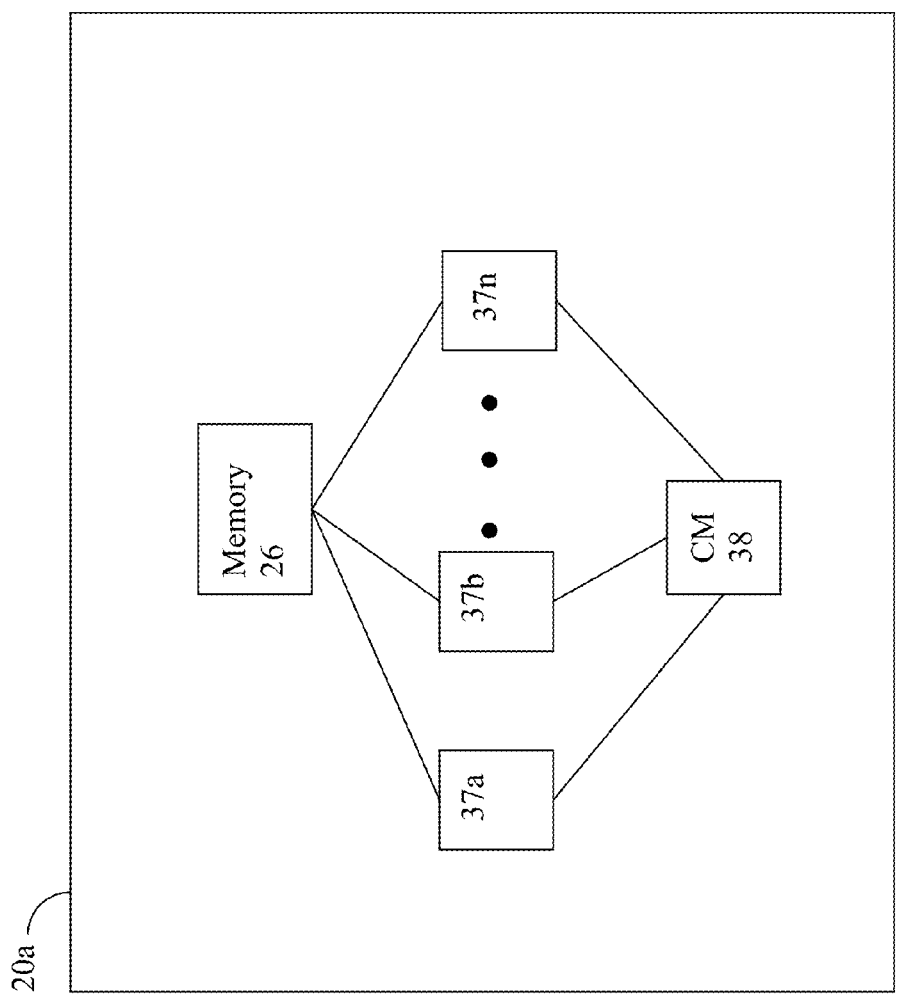
FIG. 2B is a representation of the logical internal communications between the directors and memory included in one embodiment of data storage system of FIG. 2A.

Referring to FIG. 2B, shown is a representation of the logical internal communications between the directors and memory included in a data storage system. Included in FIG. 2B is a plurality of directors 37*a*-37*n* coupled to the memory 26. Each of the directors 37*a*-37*n* represents one of the HA's, RA's, or DA's that may be included in a data storage system. Each of the directors may be, for example, a processor or a printed circuit board that includes a processor and other hardware components. In an embodiment disclosed herein, there may be up to sixteen directors coupled to the memory 26. Other embodiments may use a higher or lower maximum number of directors that may vary. For example, an embodiment in accordance with techniques herein may support up to 128 directors per data storage system, such as a data storage array. The representation of FIG. 2B also includes an optional communication module (CM) 38 that provides an alternative communication path between the directors 37*a*-37*n*. Each of the directors 37*a*-37*n* may be coupled to the CM 38 so that any one of the directors 37*a*-37*n* may send a message and/or data to any other one of the directors 37*a*-37*n* without needing to go through the memory 26. The CM 38 may be implemented using conventional MUX/router technology where a sending one of the directors 37*a*-37*n* provides an appropriate address to cause a message and/or data to be received by an intended receiving one of the directors 37*a*-37*n*. In addition, a sending one of the directors 37*a*-37*n* may be able to broadcast a message to all of the other directors 37*a*-37*n* at the same time.

A host may be able to access data, such as stored on an LV of a data storage system, using one or more different physical paths from the host to the data storage system. Described in the following paragraphs are techniques that may be used in connection with selecting a path over which to access data of a storage device when such data is accessible over multiple paths. A host may use such techniques in connection with path selection when communicating data operations, such as I/O operations, to the data storage system.

Each of the data storage systems may include code stored and executed thereon which gathers data regarding performance of the data storage system. The code may report the collected data at various times, for example, to a management system 16 for further analysis. The code may be stored on a form of computer-readable media known in the art as described elsewhere herein. The collected data may be reported to the management system 16 in accordance with a defined polling interval. At defined times, the management system 16 may request the collected data from the data storage system. Using another technique, the data storage system may automatically report the collected data to the management system 16 in accordance with a predefined time interval rather than in response to a request from the management system 16.

Figure 2C:
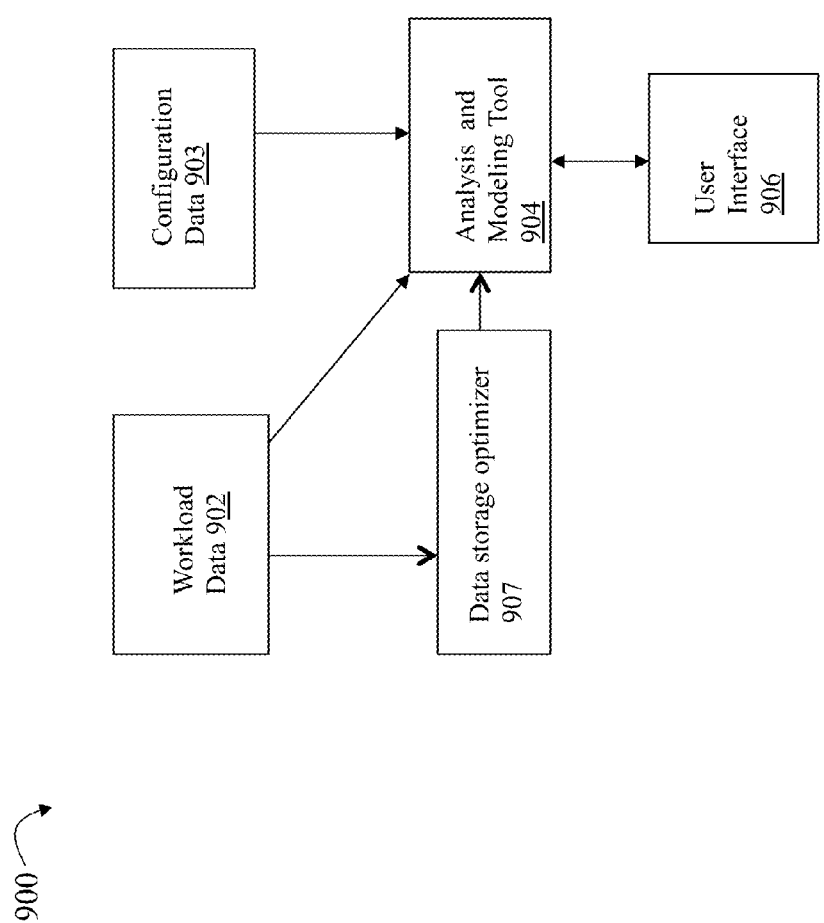
FIG. 2C is an example of software components that may be used in an embodiment in accordance with techniques herein.

Referring to FIG. 2C, shown is an example 900 of software that may be included in a an embodiment of a system in accordance with techniques herein. The software in the example 900 may reside, for example, on any of the management system 16, any of the host systems 14a-14n, data storage system, and the like.

The example 900 may include workload data 902, configuration data 903, analysis and modeling tool 904, data storage optimizer 907, and user interface 906. The workload data 902 may be based on performance data gathered about the data storage system 12. The configuration data 903 may include information describing the configuration of the data storage system. For example, the configuration data 504 may identify the different components included in the data storage system (e.g., type and number of physical drives or storage devices, number of DAs, number of FAs, which DAs and FAs (and ports thereof) are used to service I/Os for particular physical devices, which LVs are stored on which physical devices, which is the data protection level (e.g., RAID 1, RAID 5, RAID 6, etc.) for different LVs, and the like. The workload data 902 and configuration data 903 may serve as inputs (alone or in combination with possibly other inputs) to the tool 904. An embodiment of the analysis tool 904 in accordance with techniques herein may determine metrics from the workload data 902 for components of the data storage system and/or LVs described in the configuration data 903. The workload data 902 may be used by the analysis tool 904, for example, in determining a workload for one or more physical devices, logical devices or volumes (LVs), data portion of LVs (e.g., such as for thin or virtually provisioned devices described elsewhere herein), and the like. The workload may be expressed in terms of one or more different performance metrics, for example, in terms of I/O operations (e.g., I/O throughput such as number of I/Os/second, response time, and the like). In accordance with techniques herein, the analysis tool 904 may perform processing used in connection with troubleshooting or identifying data storage system performance problems. The analysis tool 904 may also perform other processing such as, for example, simulation of performance and workload conditions based on a hypothetical change to a data storage system configuration (e.g., modification to the physical storage devices in a configuration such as adding new physical storage devices, removing a physical storage device, or changing a type of storage device, a reconfiguration of what DAs and/or FAs service I/O operations for a particular LV, movement of an LV's data, or portion of the LV's data, to different physical storage device(s) (e.g., such as for a data movement optimization described elsewhere herein where data portions may be moved between different storage tiers), and the like. It should be noted that the analysis tool 904 may generally perform processing as described herein as well as other processing that may be performed in an embodiment. The analysis tool 904 may interact with a user using user interface 906. In one embodiment, the user interface 906 may be a graphical user interface providing visual indicators such as graphs, maps and other displays, to the user. The user may also make selections and provide input, such as using a keyboard, mouse, stylus, or other device of a computer system, based on the displayed information.

The example 900 also includes a data storage optimizer 907 which may perform processing for one or more different data storage optimizations. For example, the optimizer 907 may perform processing to determining data movement optimizations. The workload data 902 may also serve as an input to the optimizer 907 which attempts to enhance the performance of I/O operations, such as those I/O operations associated with data storage devices 16a-16n of the system 12. The optimizer 907 may take into consideration various types of parameters and performance or workload data in an attempt to optimize particular metrics associated with performance of the data storage system. The work load data 902 may be used by the optimizer to determine metrics described and used in connection with techniques herein. The optimizer may access the workload data, for example, collected for a plurality of LVs and/or data portions of the LVs when performing a data storage optimization to determine a workload for one or more physical devices, logical devices or volumes (LVs) serving as data devices, thin devices or other virtually provisioned devices, portions of thin devices, and the like. The workload may also be a measurement or level of "how busy" a device is, for example, in terms of I/O operations (e.g., I/O throughput such as number of I/Os/second, response time (RT), and the like).

It should be noted that the operations of read and write with respect to an LV, thin device, and the like, may be viewed as read and write requests or commands from the DA 23, controller or other backend physical device interface. Thus, these are operations may also be characterized as a number of operations with respect to the physical storage device (e.g., number of physical device reads, writes, and the like, based on physical device accesses). This is in contrast to observing or counting a number of particular types of I/O requests (e.g., reads or writes) as issued from the host and received by a front end component such as an HA 21. To illustrate, a host read request may not result in a read request or command issued to the DA if there is a cache hit and the requested data is in cache. The host read request results in a read request or command issued to the DA 23 to retrieve data from the physical drive only if there is a read miss. Furthermore, when writing data of a received host I/O request to the physical device, the host write request may result in multiple reads and/or writes by the DA 23 in addition to writing out the host or user data of the request. For example, if the data storage system implements a RAID data protection technique, such as RAID-5, additional reads and writes may be performed such as in connection with writing out additional parity information for the user data. Thus, observed data gathered and used by the optimizer 907 described herein to determine workload, such as observed numbers of reads and writes, may refer to the read and write requests or commands performed by the DA. Such read and write commands may correspond, respectively, to physical device accesses such as disk reads and writes that may result from a host I/O request received by an HA 21.

The optimizer 907 may perform data storage optimization processing such as, for example, how to allocate or partition physical storage in a multi-tiered environment for use by multiple applications. The optimizer may also perform other processing such as, for example, data movement optimization processing to determine what particular portions of devices, such as thin devices, to store on physical devices of a particular tier, evaluate when to move data between physical drives of different tiers, and the like. The optimizer 907 may perform an evaluation as to whether to perform a data optimization, evaluate which particular data portions should be moved or located in particular storage tiers, and the like. In connection with techniques described herein, the optimizer 907 may provide information regarding data movement optimizations to the analysis and modeling tool 904 so that the tool 904 may simulate or model the data movement optimization and then perform further analysis based on the modeled data storage system subsequent to the revised data storage system state based on the simulated data movement optimization. The information provided by the optimizer for data movement optimizations may include processing for automated evaluation and movement of data including such automated promotion and demotion of data portions between different storage tiers. Data portions may be automatically placed in a storage tier where the optimizer has determined the storage tier is best to service that data in order to improve data storage system performance. The data portions may also be automatically relocated or moved to a different storage tier as the work load and observed performance characteristics for the data portions change over time. Such techniques may take into account how "busy" the data portions are (e.g., such as based on one or more workload metrics such as I/O throughput or I/Os per unit of time, response time, utilization, and the like) associated with a storage tier in order to evaluate which data to store on drives of the storage tier. An embodiment of the optimizer in accordance with techniques herein may use such workload information that may characterize a current or recent workload activity for data portions and then provide information regarding data movements (e.g., promotions and/or demotions) to the tool 904.

Promotion may refer to movement of data from a first storage tier to a second storage tier where the second storage tier is characterized as having devices of higher performance than devices of the first storage tier. Demotion may refer generally to movement of data from a first storage tier to a second storage tier where the first storage tier is characterized as having devices of higher performance than devices of the second storage tier. As such, movement of data from a first tier of flash devices to a second tier of FC devices and/or SATA devices may be characterized as a demotion and movement of data from the foregoing second tier to the first tier a promotion. Thresholds may be used in connection with promotion and demotion of data portions in connection with data movement optimizations.

With reference back to FIG. 2C, an embodiment of the system described herein may include the Fully Automated Storage Tiering (FAST) product produced by EMC Corporation of Hopkinton, Mass., as the optimizer 907 providing for optimizations of the use of different storage tiers including the ability to easily create and apply tiering policies (e.g., allocation policies, data movement policies including promotion and demotion of data portions, and the like) to transparently automate the control, placement, and movement of data within a storage system based on business needs. As will be appreciated by those skilled in the art, FAST is only one example of a data storage optimizer that may be used in an embodiment in connection with techniques herein.

Workload such as for an LV or component of the data storage system may be determined using some measure of I/O intensity, performance or activity (e.g., I/O throughput/second, percentage or number of read operations processed in a time period, percentage or number of write operations processed in a time period, read hits, read misses, and the like). Some examples of different performance metrics used in characterizing the workload of the data system, one of its components, and the like, are described herein.

Other measurements of how busy an LV or component is may be expressed in other ways. For example, response times and utilization are metrics measuring a level of how busy a system and/or its components are. The response time as mentioned above may be determined based on workload data collected. In connection with techniques herein, the response times described herein may be determined from the data storage system's perspective as the amount of time measured from when an I/O operation is received by a front end data storage system component, such as an FA, to when the FA has completed servicing the I/O operation (e.g., so that the I/O operation is no longer considered pending or in-progress on the data storage system). One aspect of the techniques herein uses a number of I/Os per second based on workload data collected where visualization or display of those values in graphical form may be used to identify LVs, or portions thereof, for use with techniques herein in connection with selective placement of LV data on particular storage tiers. The number of I/Os per second may be a maximum or peak such value for a given LV within a time period.

It should be noted that the workload data 902 used as an input to the tool 904 may be obtained through actual observations of collected data through execution of a data storage system. Some or all of the workload data 902 may also be determined in other suitable ways known in the art such as through simulation, estimation and/or experimentally determined through other modeling and estimation techniques. For example, the data collected may related to executing a particular application such as a database or email application where such data may have to be further modified or mapped to the particular metrics used as an input to the tool 904. For example, information regarding a number of users of a database or email application and a level of usage for each of these users (e.g., denoting a usage level such as "heavy", "moderate" or "light", or a numeric scaled rating such as an integer from 1 to N, N denoting a number of tiered usage levels) may be the initial set of information provided as an input. This initial set of information may be characterized as an initial set of activity data that may be further processed. For example, the initial set of activity data may be mapped or translated into second activity data such as related to one or more other metrics (e.g., I/O throughput per unit of time, and the like) used in connection with techniques herein. In this manner, the workload data 902 representing activity data may include any of observed activity data based on actual data storage system performance in connection with servicing I/O operations, activity data obtained through simulation, and estimated activity data. The actual activity data input or used with techniques herein may be indirectly obtained by processing an initial set of activity data to generate second activity data expressed in terms of the appropriate metrics for use or consumption with the modeling and simulation described herein.

Utilization is another metric that may be used in an embodiment in connection with techniques herein for measuring or quantifying how busy a component in the data storage system is. Utilization may be expressed as a percentage and may refer to the amount of time a component or system is working versus its respective idle time. Utilization may be simulated and is workload dependent. Utilization may be expressed as a function of one or more factors, parameters or variables including any workload performance characteristic or metric and may vary for the particular component. Some exemplary metrics are described herein. These, alone or in combination with other suitable metrics may be used in connection with determining utilization. Generally, expected utilization levels for a component given certain conditions may be known such as through prior experimentation and/or vendor supplied information. For example, a component's utilization may be expressed as a function of one or more parameters (e.g., one or more metrics such as response time, and/or I/O throughput per unit of time, and/or average I/O size, and the like) and the achieved utilization results from values supplied for the one or more parameters. Therefore, utilization may be simulated based on a set of parameters values, such as those which may be based on actual and/or simulated workload data used in measuring the utilization of a component. The factors used in determining utilization may vary with component and its function within a system. Work loads and utilizations do not necessarily behave empirically in a linear manner. For example, if one measures a 60% utilization for a particular workload, adding 10% to this workload may result in a 90% utilization, not 70%, as one might expect. Therefore when analyzing utilization, it is good practice to consider granularity or resolution. The analysis of the utilizations for a given data storage system may be different for different components.

The tool 904 may be used in determining the workload, utilization and other information regarding components of the data storage system in accordance with techniques herein such as for modeled data storage system configurations as described in more detail below.

Figure 2D:
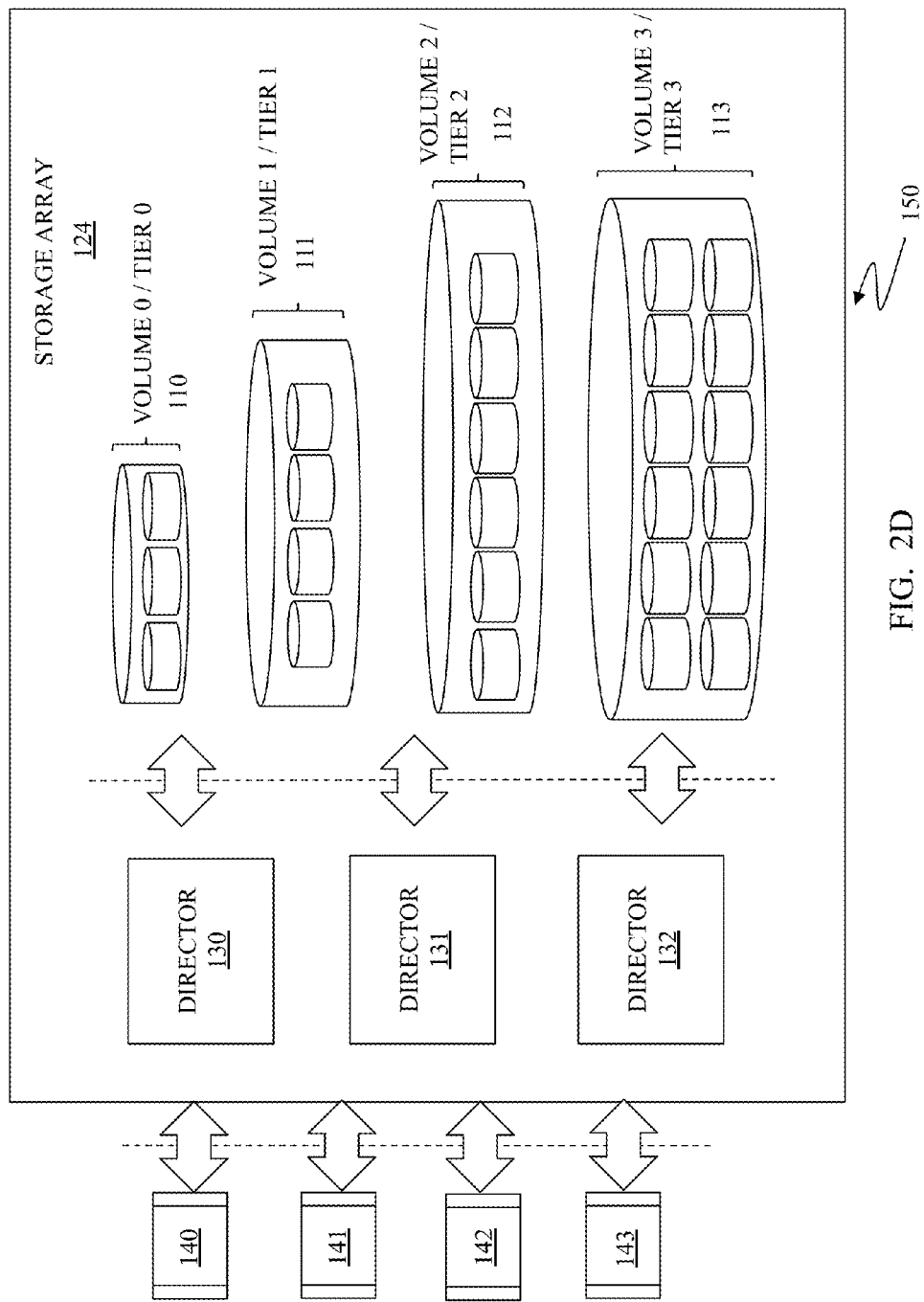
FIG. 2D is an example illustrating a multi-tiered storage system as may be used in connection with techniques herein.

FIG. 2D is a schematic illustration showing a storage system 150 that may be used in connection with an embodiment of the system described herein. The storage system 150 may include a storage array 124 having multiple directors 130-132 and multiple storage volumes (LVs, logical devices or VOLUMES 0-3) 110-113. Host applications 140-143 and/or other entities (e.g., other storage devices, SAN switches, etc.) request data writes and data reads to and from the storage array 124 that are facilitated using one or more of the directors 130-132. The storage array 124 may include similar features as that discussed above.

The volumes 110-113 may be provided in multiple storage tiers (TIERS 0-3) that may have different storage characteristics, such as speed, cost, reliability, availability, security and/or other characteristics. As described above, a tier may represent a set of storage resources, such as physical storage devices, residing in a storage platform. Examples of storage disks that may be used as storage resources within a storage array of a tier may include sets SATA rotating disks, FC rotating disks and/or EFDs (enterprise flash drives or more generally solid state storage), among other known types of storage devices. In connection with an embodiment having three storage tiers of EFD, FC and SATA devices the following may denote the relative performance classifications of each tier based on the particular drive technology— EFD (highest performance tier), FC (mid-range or second level performance tier) and SATA (lowest or third level performance storage tier)).

Generally, an embodiment in accordance with techniques herein may have one or more defined storage tiers. Each tier may generally include physical storage devices or drives having one or more attributes associated with a definition for that tier. For example, one embodiment may provide a tier definition based on a set of one or more attributes. The attributes may include any one or more of a storage type or storage technology, a type of data protection, device performance characteristic(s), storage capacity, and the like. The storage type or technology may specify whether a physical storage device is an SSD drive (such as a flash drive), a particular type of SSD drive (such using flash or a form of RAM), a type of magnetic disk or other non-SSD drive (such as an FC disk drive, a SATA (Serial Advanced Technology Attachment) drive), and the like. Data protection may specify a type or level of data storage protection such, for example, as a particular RAID level (e.g., RAID1, RAID-5 3+1, RAID5 7+1, and the like). Performance characteristics may relate to different performance aspects of the physical storage devices of a particular type or technology. For example, there may be multiple types of FC disk drives based on the RPM characteristics of the FC disk drives (e.g., 10K RPM FC drives and 15K RPM FC drives) and FC disk drives having different RPM characteristics may be included in different storage tiers. Storage capacity may specify the amount of data, such as in bytes, that may be stored on the drives. An embodiment may allow a user to define one or more such storage tiers. For example, an embodiment in accordance with techniques herein may define two storage tiers including a first tier of all SSD drives and a second tier of all non-SSD drives. As another example, an embodiment in accordance with techniques herein may define three storage tiers as noted above including a first tier of all SSD drives which are flash drives, a second tier of all FC drives, and a third tier of all SATA drives. The foregoing are some examples of tier definitions and other tier definitions may be specified in accordance with techniques herein. It should be noted that one or more of the storage tiers may be included in one or more different and external data storage systems. Such data storage systems may be "external" with respect to the target data storage system. The storage tiers may be generally defined across one or more data storage systems (e.g., such as may be included in a data storage federation) and the data movement optimizations as described herein which may be simulated may be performed across all such data storage systems.

According to various embodiments, each of the volumes 110-113 may be located in different storage tiers. Tiered storage provides that data may be initially allocated to a particular fast volume/tier, but a portion of the data that has not been used over a period of time (for example, three weeks) may be automatically moved to a slower (and perhaps less expensive) tier. For example, data that is expected to be used frequently, for example database indices, may be initially written directly to fast storage whereas data that is not expected to be accessed frequently, for example backup or archived data, may be initially written to slower storage.

In one embodiment, data storage movement optimizations may be performed in connection with data portions of thin devices or virtually provisioned (VP) logical devices. A thin or VP device presents a logical storage space to one or more applications running on a host where different portions of the logical storage space may or may not have corresponding physical storage space associated therewith. However, the thin device is not mapped directly to physical storage space. Instead, portions of the thin storage device for which physical storage space exists are mapped to data devices, which are logical devices that map logical storage space of the data device to physical storage space on the disk drives or other physical storage devices. Thus, an access of the logical storage space of the thin device results in either a null pointer (or equivalent) indicating that no corresponding physical storage space has yet been allocated, or results in a reference to a data device which in turn references the underlying physical storage space. The thin device may represent a certain capacity having an associated address range. Storage may be allocated for thin devices in chunks or data portions of a particular size as needed rather than allocate all storage necessary for the thin device's entire capacity. Therefore, it may be the case that at any point in time, only a small number of portions or chunks of the thin device actually are allocated and consume physical storage on the back end (on physical disks, flash or other physical storage devices). A thin device may be constructed of chunks having a size that may vary with embodiment. For example, in one embodiment, a chunk may correspond to a group of 12 tracks (e.g., 12 tracks*64 Kbytes/track=768 Kbytes/chunk). As also noted with a thin device, the different chunks may reside on different data devices in one or more storage tiers.

Thin or VP devices and thin provisioning are described in more detail in U.S. patent application Ser. No. 11/726,831, filed Mar. 23, 2007 (U.S. Patent App. Pub. No. 2009/0070541 A1), AUTOMATED INFORMATION LIFECYCLE MANAGEMENT WITH THIN PROVISIONING, Yochai, EMS-147US, and U.S. Pat. No. 7,949,637, Issued May 24, 2011, Storage Management for Fine Grained Tiered Storage with Thin Provisioning, to Burke, both of which are incorporated by reference herein. Although the optimizer 907 may provide information regarding data storage movement optimization for VP device data portions to relocate the most active data to the highest available performance storage tier and/or relocating the least active data to the lowest or lower performance storage tier(s), an embodiment may more generally use the techniques herein in connection with data movement optimizations for data portions of other types of devices such as "thick devices" where the full device storage capacity is allocated and bound to the device. In such an embodiment having thin or other devices where data movement optimizations may be performed on a data portion that is less than the entire device, workload data may be obtained per data portion for use in connection with techniques herein.

Techniques will be described in connection with creating and modeling or simulating the workload and performance of a target data storage system configuration. Additionally, the modeling or simulation state of the target data storage system may be subsequently updated after completing a simulating data movement optimization. As will be appreciated by those skilled in the art, simulation may be performed in response to a change in the target data storage system configuration such as moving a data portion from a first physical device to a second physical device. In this case, the simulation may be updated to reflect any changes in workload of the data portion which are attributed to the first physical device prior to the simulated data movement and then attributed to the second physical device after performing the simulated data movement. The foregoing as well as other modeling and simulation may be performed by the analysis and modeling tool 904 of FIG. 2C. As described in the following paragraphs, described is an embodiment of the tool that will provide for creating or defining a target data storage system for which simulation is performed. For example, the target data storage system may have a configuration of a new data storage system. The tool may apply the workload of a current or source data storage system to the target data storage system configuration for which performance and workload are modeled or simulated based on the source data storage system workload. The target data storage system being modeled may have different physical drives and tiers than the source system. Additionally, it should be noted that rather than have a target configuration being simulated relate to only single target data storage system, the target being simulated may actually be with respect multiple target data storage systems such as may be providing multiple different storage tiers in an embodiment in accordance with techniques herein.

What will now be described are various screenshots as may be displayed in connection with a user interface such as in an embodiment of the tool 904 of FIG. 2C. As illustrated below, a target configuration may be created using the tool for which simulation and modeling may be performed in accordance with techniques herein. It should be noted that generally, the target data storage system configuration (e.g., target system) may be the simulated system. In some embodiments the target system may have a configuration that is a variation of an existing or source data storage system. In other embodiments, the target system may have the same configuration as the source system for which additional modeling and simulation is performed.

Figure 3:
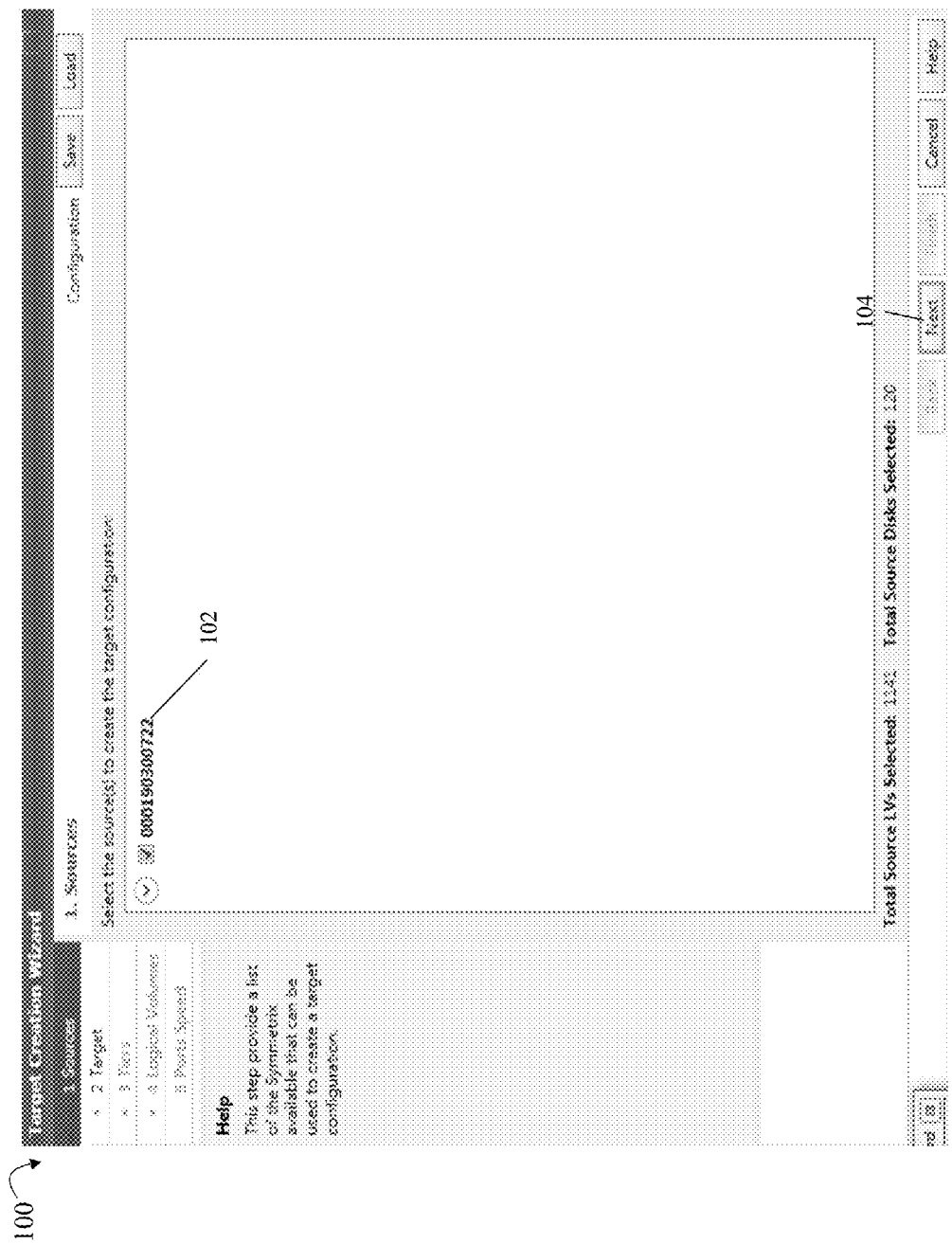
FIGS. 3, 4, 5, 6, 6A, 6B, 6C, 6D, 6E, 11A and 11B are examples of screenshots that may be displayed on a user interface in an embodiment in connection with techniques herein.

Referring to FIG. 3, shown is an example 100 of a first screenshot of a wizard that may be used in connection with selecting the source configuration. The example 100 may include a list of one or more source data storage systems to be used as the source (e.g., "before" or starting) configuration. Although only a single data storage system 102, such as denoting a single data storage array, is illustrated in the example 100, a user may select one or more such data storage systems from a list. In this way, the workload, and associated configuration for all such selected data storage systems may be considered in the aggregate collectively as the source configuration. For example, the list displayed in 100 may include 3 data storage arrays and all 3 such data storage arrays may be selected as the source configuration. In this manner, the aggregated LVs, and their workload (along with possibly other logical entities such as storage groups, RDF groups, and the like) may be considered as the "merged" source configuration for use with techniques herein in modeling a target system. For simplicity of illustration, a user may select 102 as the single data storage system for use and then select the next button 104. Additionally, it should be noted that the source configuration information may include additional information about the LVs such as the size or capacity of the LV, the data protection such as RAID level and configuration of the underlying physical devices upon which the LV's data is stored, and the like.

Figure 4:
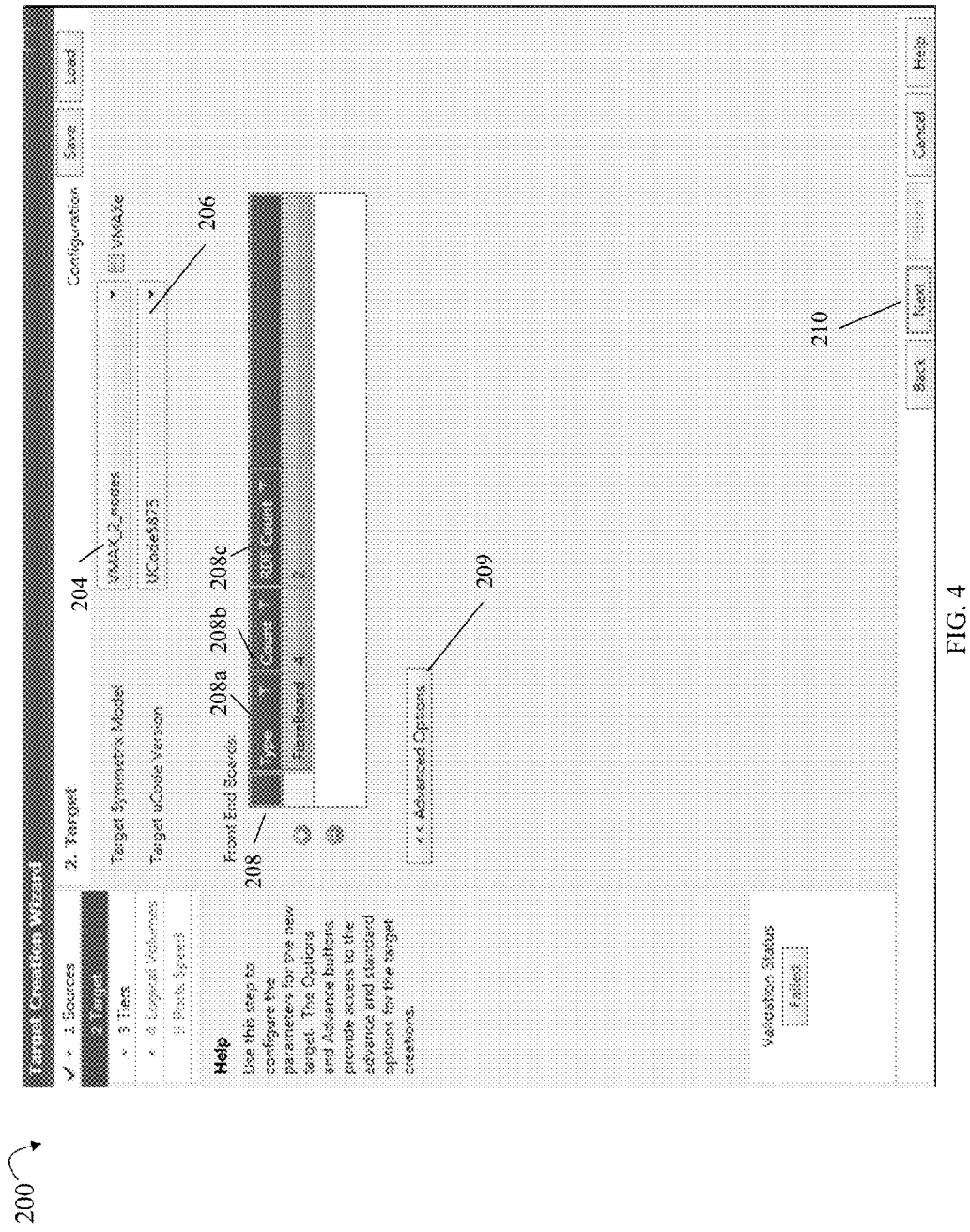

Referring to FIG. 4, shown is an example of a second screenshot that may be used in connection with creating the target configuration. The screenshot 200 may be displayed as a result of selecting the next button 104 from FIG. 3 to configure the parameters for the new target for which simulation or modeling is performed. In the example 200, the user may select options affecting the modeled target configuration. For example, element 204 provides a configurable option for selecting the number of nodes (e.g., engines or boards of components) included in the target configuration for a particular data storage system model (e.g., such as a data storage system sold under the trademark Symmetrix VMAX™ data storage system, VNX™ data storage system, and the like). For example, an engine or board may include components such as a number of FAs, DAs, an amount of memory or cache, and the like. Selection of a particular number of boards in 204 thereby affects the amount of resources or components in the target configuration as well as the particular data storage system model. In connection with 204 and 206, a drop down menu with multiple options may be displayed and selection of a single option may result in display as included in the example 200. Element 206 provides a configurable option for selecting a particular microcode version that runs on the target configuration. Element 208 provides a configurable option for front end board specification such as particular type 208a, a count 208b denoting the number of boards, and an RDF count 208c denoting a number of RA components that may be used in connection with providing RDF services as described elsewhere herein. Although not illustrated further in connection with the example 200, it should be noted that an embodiment may also provide for additional advanced configuration options 209. Once the selection of the options in 200 is completed, the user may select the next button 210.

Consistent with description elsewhere herein, the target configuration being simulated may relate to only single target data storage system or may also include multiple target data storage systems such as may be the case in connection with a data storage system federation providing multiple different storage tiers in an embodiment in accordance with techniques herein. Thus, generally, the modeling techniques herein may include a source configuration based on one or more source data storage systems and a target configuration based on one or more target data storage systems.

It should be noted that selection of the particular model in 204 indicating a number of engines for a particular type of data storage system in combination with the front end board configuration selections 208 may provide for identifying the various hardware components of the target configuration including, for example, a number of front end ports, a number of front end CPUs, a number of front end boards, an amount of cache or global memory, a number of back end ports, a number of back end CPUs, and a number of back end boards. As described herein, the "front end" related component (e.g., CPUs, ports, etc.) may be components related to FAs such as described elsewhere herein used in connection with host front end communications. The "back end" related component (e.g., CPUs, ports, etc.) may be components related to DA such as described elsewhere herein used in connection with accessing the physical storage devices.

Figure 5:
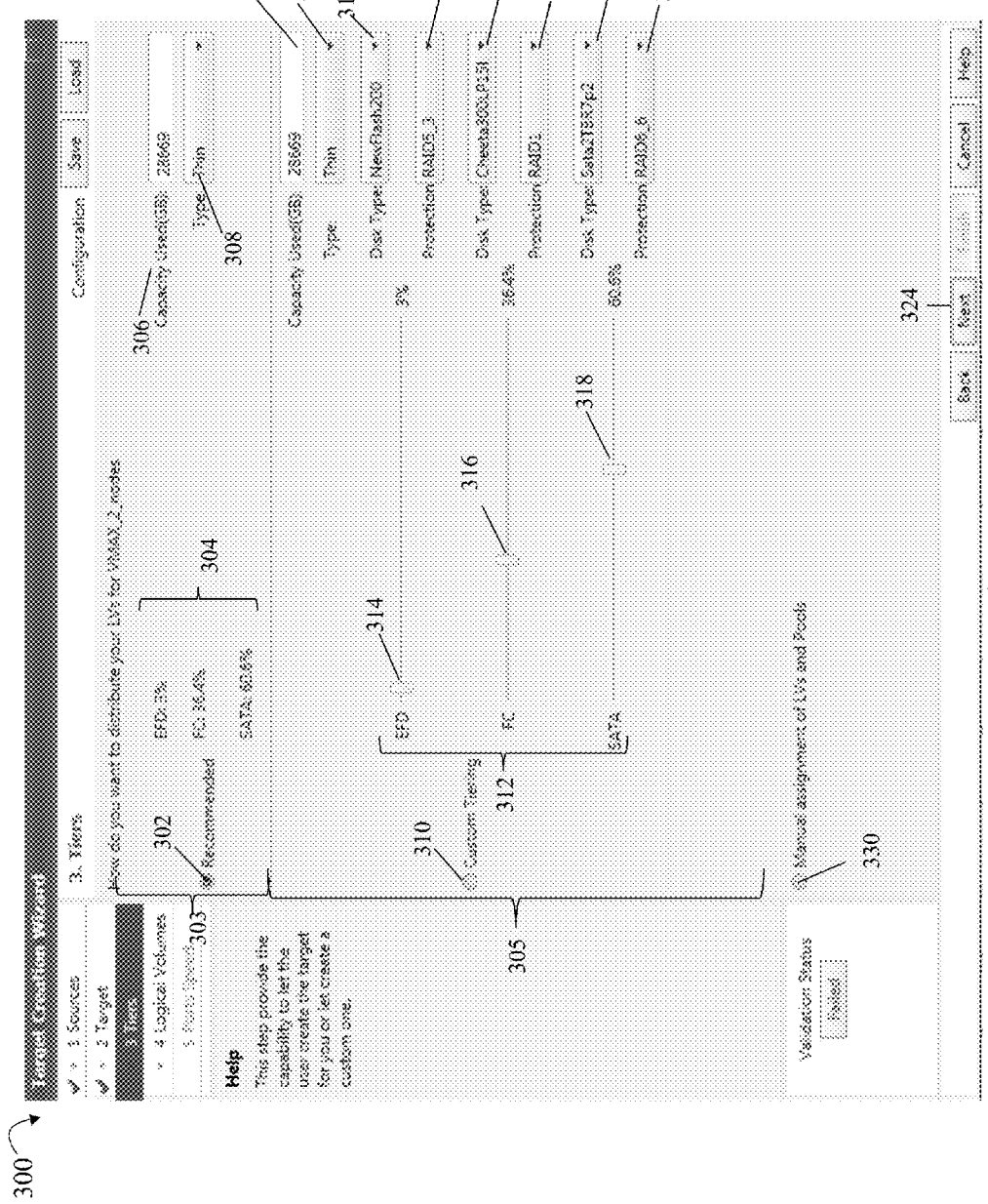

Referring to FIG. 5, shown is an example of a third screenshot that may be used in connection with configuring the LVs and associated storage tiers in an embodiment in accordance with techniques herein. The screenshot 300 may be displayed as a result of selecting the next button 210 from FIG. 4 to configure the LVs and associated storage tiers for the new target for which simulation or modeling is performed. In connection with the example 300, options are provided that may be selected in connection with configuring the underlying physical storage devices and associated storage tiers and for mapping the LVs to physical devices in the target configuration. A user may select defaults or recommended options 302 included in portion 303 of the screen, may select an option to customize the storage tiering 310 as included in portion 305 of the screen, or may select an option to perform manual assignment of LVs and pools 330.

The recommended or default options 302 may be determined in accordance with best practices. Selection of 302 results a target configuration having a recommended percentage distribution 304 in the various storage tiers in the system. In this example, there may be three storage tiers—EFD (Enterprise Flash Drives), FC (Fibre channel) rotating disk drives and SATA rotating disk drives. In this example, the storage tiers in terms of performance, from highest to lowest are EFD (highest performance tier), FC (middle performance tier) and SATA (lowest performance tier). Element 306 denotes the total capacity for the LVs. The percentages of 304 total 100% corresponding to the total capacity 306. Each of the percentages in 304 denotes a percentage of a particular storage tier with respect to the total capacity of 306. In this example, 3% of the total used capacity (306) is comprised of EFD drives, 36.4% of the total used capacity 306 is comprised of FC drives and the remaining 60.6% of the total used capacity is comprised of SATA drives. Element 308 provides for selection of a particular type of LV, such as thick or thin. Thin devices may also be referred to as virtually provisioned devices as described elsewhere herein. The total LV capacity 306 may be specified in connection with the total LV capacity based on the particular source system configuration selected in connection with the previous screenshot 100. It should be noted that there may be other defaults which are used other than those specified and displayed in area 303. For example, a default RAID protection level and configuration may be used although not displayed in area 303.

Rather than use the foregoing default or recommended options, customization of the storage for tiers may be performed by selecting 310. Element 312 denotes the different three storage tiers and includes a slider that may be used to select a particular percentage of each storage tier for the target configuration. For example, 314 may be used to customize the percentage of EFD, 316 may be used to customize the percentage of FC and 318 may be used to customize the percentage of SATA. Percentages in 312 are with respect to the total used capacity 320. Elements 320 and 322 are similar, respectively, to 306 and 308 as described above. Elements 314a, 314b provides for customized selection of option for the EFD storage tier. Elements 316a, 316b provides for customized selection of option for the FC storage tier. Elements 318a, 318b provides for customized selection of option for the SATA storage tier. Elements 314a, 316a and 318a allow the user to select a particular type of disk drives for the storage tier. For example, element 314a may be a particular flash drive type selected from a menu. Elements 314b, 316b and 318b allow the user to select RAID protection level and configuration for each of the storage tiers. For example, element 314b denotes a RAID-5 configuration for EFD, a RAID-1 configuration for FC and a RAID-6 configuration for SATA. Information of 305 may be initially populated with starting values based on the defaults or recommended options which may be further modified by the user.

Figure 6:
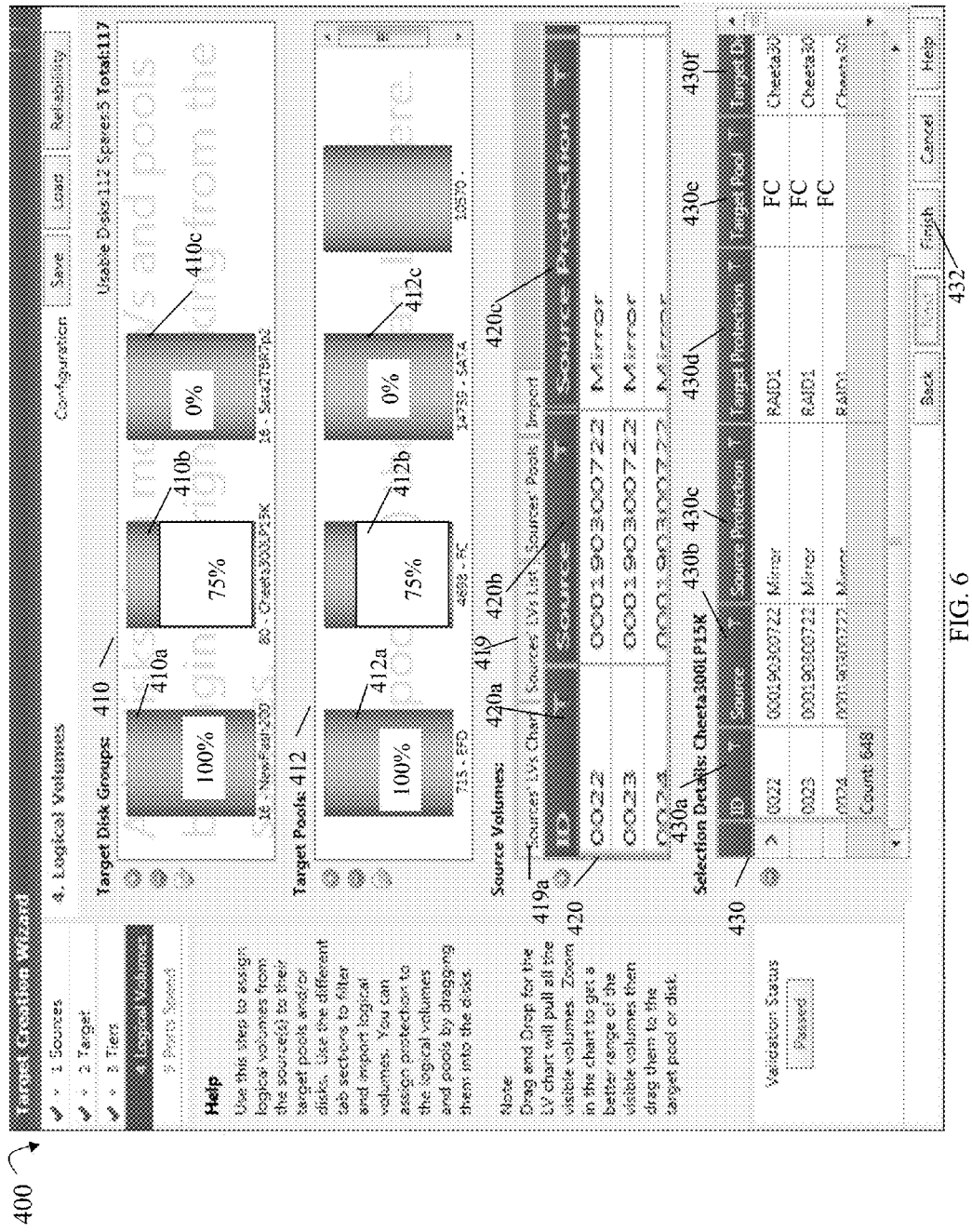

If the user has selected either 302 or 310 and then selects the next button 324, the screenshot 400 of FIG. 6 may be displayed. The example 400 illustrates the results of automated processing performed to automatically determine target disk groups 410 including the appropriate number of different physical drives needed to provide the requested total capacity used (e.g., denoted by 306, 320), configure the one or more target pools 412 from the target disk groups

410, and initially place or map the LVs from the source configuration to a selected one of the target pools as will now be described further in connection with FIG. 6.

Processing performed in response to selection of 330 for manual assignment of LVs and pools is described below subsequent to discussion regarding FIG. 6.

Referring to FIG. 6, shown is an example of a fourth screenshot of the target creation wizard that may be used in connection with assigning or mapping LVs from the source to target pools and/or disks of particular storage tiers. The screenshot 400 may be displayed as a result of selecting the next button 324 from FIG. 5 if the user has selected either 302 or 310 from FIG. 5. The example 400 illustrates the automated processing performed to initially map or place the LVs into the target pools. The example 400 illustrates the number of physical drives or devices of each storage tier needed to provide the particular percentages of the total usable capacity from the default 302 in the example 300. Element 410 denotes the different target disk groups of the different disk types needed to supply the total capacity denoted in 306 of the example 300 along with some additional drives that may be used as spare drives. It should be noted that target disk groups may also correspond to the different storage tiers in an embodiment as described herein. To provide the total capacity denoted in 306 along with an additional 5 spare drives, there are three disk groups—disk group 410*a* of 16 flash drives, disk group 410*b* of 80 FC drives, and disk group 410*c* of 16 SATA drives. The target disk groups 410 may be configured into target storage pools of the different storage tiers—EFD 412*a*, FC 412*b* and SATA 412*c*—along with an additional pool 412*d* for use with the LVs. Pool 412*d* may include physical devices used in connection with providing ancillary services or operations, for example in connection with performing particular data services such as creating snapshots.

It should be noted that the total capacity 306 of the example 300 may denote the usable storage capacity in terms of user data that can be stored. However, the amount of raw storage capacity used (and thus the number of underlying physical storage devices needed) to provide the total usable capacity 306 may be greater than the amount denoted by the total capacity 306. The raw capacity may be greater due to the selected protection such as RAID level and configuration. For example, as known in the art, various RAID-5 and RAID-6 protection schemes use such additional raw capacity to store parity information in addition to the actual user data whereby such parity data may be used in providing data protection in that the RAID group has the ability to rebuild and recover from a drive member failure. Additionally, the total usable capacity 306 may be based on LVs which are thin devices or thick devices. In connection with thick devices, the physical drives of 410 and 412 may be allocated to provide storage for the entire total capacity 306. However, in connection with thin or virtually provisioned devices, the total capacity 306 may represent the total usable capacity or amount of user data that can be stored which may be less than or equal to the logical address range or virtual capacity of the thin device. For example, a thin device may have a logical block address (LBA) range of 5 GB. However, physical devices may be provisioned for use with the thin device which provide for the total usable capacity of storage for storing only 4 GB of data. Furthermore, if this thin device is based on a RAID-1 or mirroring protection scheme, the raw capacity may be 8 GB. Thus, the total capacity on 306 of FIG. 5 may be 4 GB and the amount of raw capacity of the physical drives may be based on this total capacity 306 (which may be less than the logical or virtually represented capacity of the thin device and its associated LBA range). As described elsewhere herein, physical storage for thin devices may be allocated from a particular storage pool as needed when first storing data to a particular logical address of the thin device. Thus, at a point in time, storage may not be allocated for the entire logical address range of a thin device. With respect to a thin device, its logical address range may be characterized as representing a logical or virtual capacity for which an amount of storage may be allocated to provide a total usable capacity as represented in 306 (representing the total capacity of the thin device for storing user data). In this manner, where the total capacity 306 is for a thin device, an embodiment may optionally choose to configure the amount of physical storage devices and associated raw capacity for the thin devices in the same manner as thick device (e.g., where the total usable capacity 306 equals the thin device's logical or virtual capacity). Alternatively, an embodiment may optionally choose to configure the amount of physical storage devices and associated raw capacity for thin devices based on a total usable capacity 306 that is some amount less than the logical or virtual capacity for thin devices since it may be presumed that physical storage may not be allocated for the entire thin device logical address range. For example, if the logical or virtual capacity or a thin device is 2 TB (terabytes) of user data storage, the amount of total usable capacity 306 may be 1.5 TB and therefore the underlying physical storage devices may actually provide for storing some amount of user data represented as the total usable capacity, such as 1.5 TB, which is less than the logical address range of the thin device. The foregoing lesser amount may also be referred to as providing for oversubscription of storage for thin or virtually provisioned devices. The foregoing option of whether to provide oversubscription (e.g., whereby the logical or virtual capacity of the thin device as may be presented to the host for storing user data is more than which can actually be provided by the raw storage capacity of the physical storage devices) in connection with target configuration modeling and/or selecting a particular oversubscription factor (e.g., denoting a difference or scaling factor between the logical or virtual thin device capacity presented to the user for storing user data and the actual amount of capacity for storing user data provided by the total capacity 306 and underlying raw storage capacity) may be provided as different modeling options in an embodiment in accordance with techniques herein.

The initial mapping or placement of each LV of the source configuration into one of the target pools of a particular storage tier may be based on one or more criteria. Such criteria may include workload or activity information for the particular LV. For example, the system may automatically determine to initially place the data for the LVs from the source configuration in particular target pools based on I/O throughput for the LVs. In this manner, the LVs having the maximum or largest I/O throughput may be placed in the highest performing EFD tier. The percentages in each of 410*a*-410*c* may denote the percentages of the disk groups utilized in connection with forming the target pools 412 and the initial placement or mapping of LVs. In a similar manner, the percentages in each of 412*a*-412*c* may denote the percentages of the target pools utilized in connection with initial placement or mapping of LVs. In connection with the illustrated example 400, 100% of the EFD target pool 412*a*, 75% of the FC target pool 412*b* and 0% of the SATA pool 412*c* are utilized in connection with storing LV data as a result of the above-mentioned automated initial mapping or placement of LV data in storage tiers and pools of the target configuration. In one embodiment, the automated initial mapping or placement of LVs may sort the LVs based on one or more workload metrics for each LV and then begin filling the target pools of the highest storage tiers with the LVs having the highest workload (e.g., ranked highest based on the workload). Once the target pool of the EFD tier is filled to capacity, processing may continue with placing the next highest ranked LVs (in terms of the workload metric(s)) in the FC target pool. If the FC target pool does not have sufficient capacity to store the data from the LVs not placed in the EFD tier, any remaining LVs may have their data placed on physical drives of the SATA tier. In this manner, the highest performing storage tiers and pools may initially contain data of LVs having the highest workload.

It should be noted that FIGS. 5 and 6 illustrate steps in connection with LVs which are thin or virtually provisioned devices. In connection with thin devices, processing may include creation of target disk groups as in 410 of the different storage tiers and then forming target pools of different storage tiers as in 412 where the target pools are used in connection with provisioning storage for thin devices. In contrast in connection with thick devices, processing may include creation of target groups as in 410 and then LVs may be mapped directly to a particular target group of 410 thereby omitting the creation of target pools 412.

In some embodiments, the initial mapping or placement of each LV into a target pool or target disk group of a particular storage tier may take into consideration criteria including the LV's workload alone or in combination with other criteria such as, the LV capacity or size, and/or the LV's protection (e.g. RAID level and configuration) as well as the capacity of the target pool or target disk group and performance characteristics of the physical devices in the target pool or target disk group. For example, an LV may be mapped to a particular target pool having PDs of a storage tier based on the LV workload. The LV mapping criteria may also consider the protection specified for the LV including the data being mapped. For example, the LV may have a specified protection level such as RAID-1 and it may be desirable to move any data portions of the LV to a physical device location in a target pool or tier having the same protection level (e.g., matching RAID protection level and configuration). As a variation, the LV may have a specified protection level such as RAID-1 and it may be desirable to move any data portions of the LV to a physical device location in a target pool or tier having the same protection level or higher than that of the LV (e.g., LV has RAID-1 where N=1 denoting the RAID protection level so the target PD needs to be in a target pool configured with at least RAID-N protection level, N being equal to or greater than 1).

By selecting one of the target disk groups 410a-410c or one of the target pools 412a-412c, a user may view details regarding the LVs mapped to the selected target disk group or target pool at a point in time such as by the automated LV mapping. For example, selection of 410b (such as with a pointing or selection device) may result in populating table 430 with details regarding the LVs having their data initially placed in the target disk group 410b. In this table 430, information about the selected target disk group 410b may include the LV ID 430a, the particular source data storage system or array configuration having an ID denoted in 430b, the source protection 430c (denoting the data protection provided for the LVs data in the source configuration such as by a particular RAID level), the target protection 430d (denoting the data protection provided for the LVs data in the target configuration), the target pool 430e, and the target disk group 430f. It should be noted that the source ID in 430b may match a unique source data storage system identifier such as denoted in the selection of sources as illustrated in connection with the example 100.

Table 420 may be used to view information on the LVs of the source configuration such as may vary depending on the particular tab selected. For example, selection of sources' LV list tab 419 may be used to display information about the LVs of the source system. In the example 400, the information displayed about the LVs of the source system may include the LV ID 420, the source ID 420b denoting the particular source data storage system or array configuration, and the source protection 420c. It should be noted that the source ID in 420b may match a unique source data storage system identifier such as denoted in the selection of sources illustrated in connection with the example 100. As illustrated in connection with other figures described elsewhere herein, other tabs of table 420, such as the sources' LV chart tab 419a, may be used to view and sort the LVs based on information such as one or more workload metrics (e.g., I/O throughput such as average or maximum number of I/Os per second). A user may further manually modify the automated LV mapping by displaying such LV information, selecting (e.g., dragging) one or more of the LVs from 420, and then dropping the selected LVs into a desired target disk group of 410 or target pool of 412.

Figure 6A:
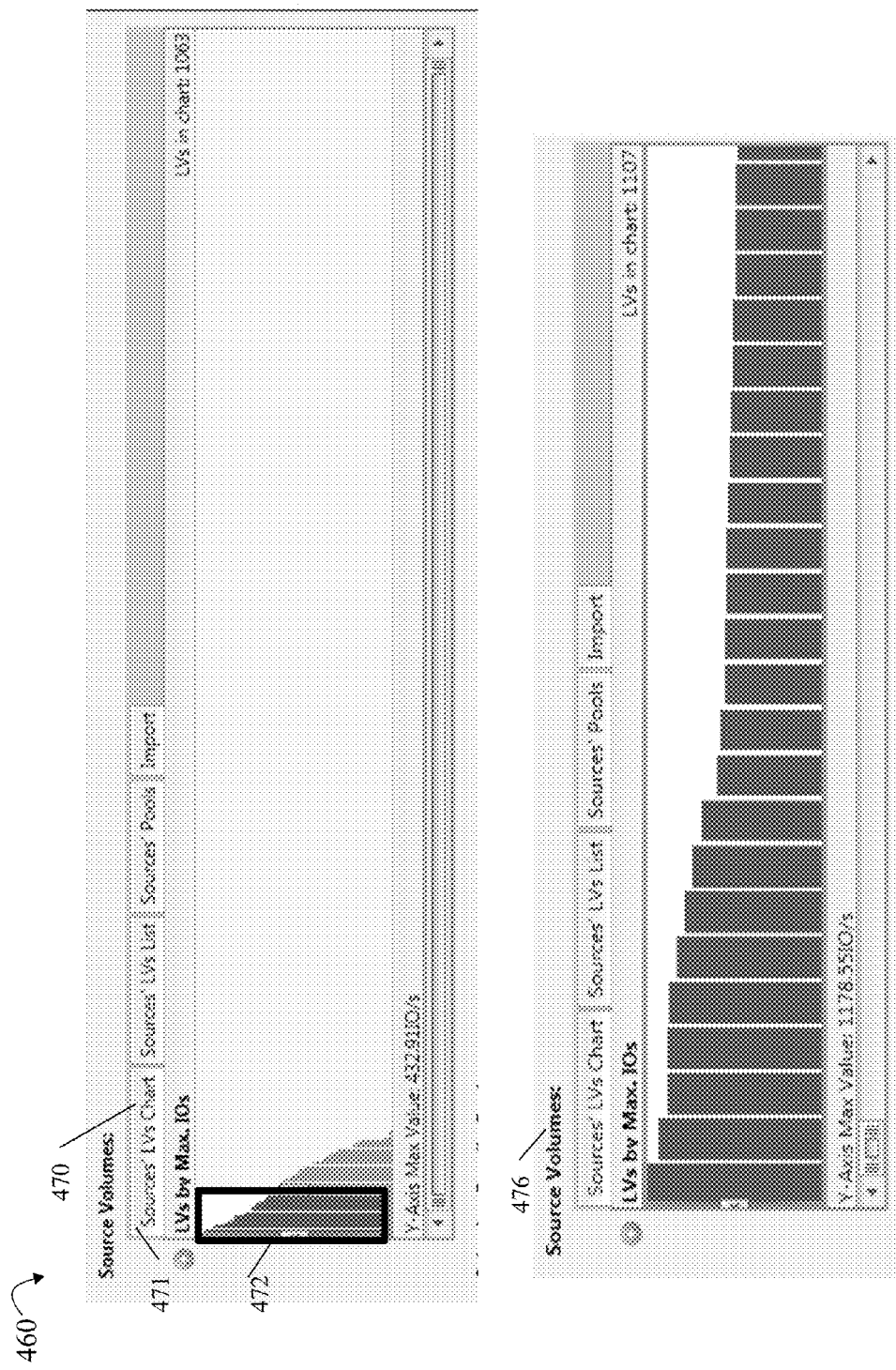

Referring to FIG. 6A, shown is an example of another way in which information about source LVs may be viewed in an embodiment in accordance techniques herein. The example 460 includes a first table 470 which may be populated graphically with information about the workload of the LVs in the source configuration if the sources' LV chart tab 471 is selected. In this example, selection of 470 may result in displaying a sorted list of LVs based on the number of I/Os per second such as the average number of I/Os per second observed for a time period, the maximum number of I/Os per second observed for a given time period, or some other workload metric. In the example 460, the Y axis may denote the maximum number of I/Os per second observed for a time period for each of the LUNs and may be sorted in decreasing order of this metric. The user may then select some portion 472 of the displayed LV information to zoom in on a particular set of one or more LVs having the largest metric values resulting in an updated display of 476. In this manner a user may select a group of LVs denoted by 472 or one or more particular LVs from 476. The user may then use the selected one or more LVs to further manually modify the automated LV mapping by then dropping the selected LVs in a desired target disk group of 410 or target pool of 412 as described above. If a user performs such a selection resulting in manually moving one or more LVs to a particular storage tier/target disk group or target pool, the amount of used or consumed capacity may be accordingly updated.

Figure 6B:
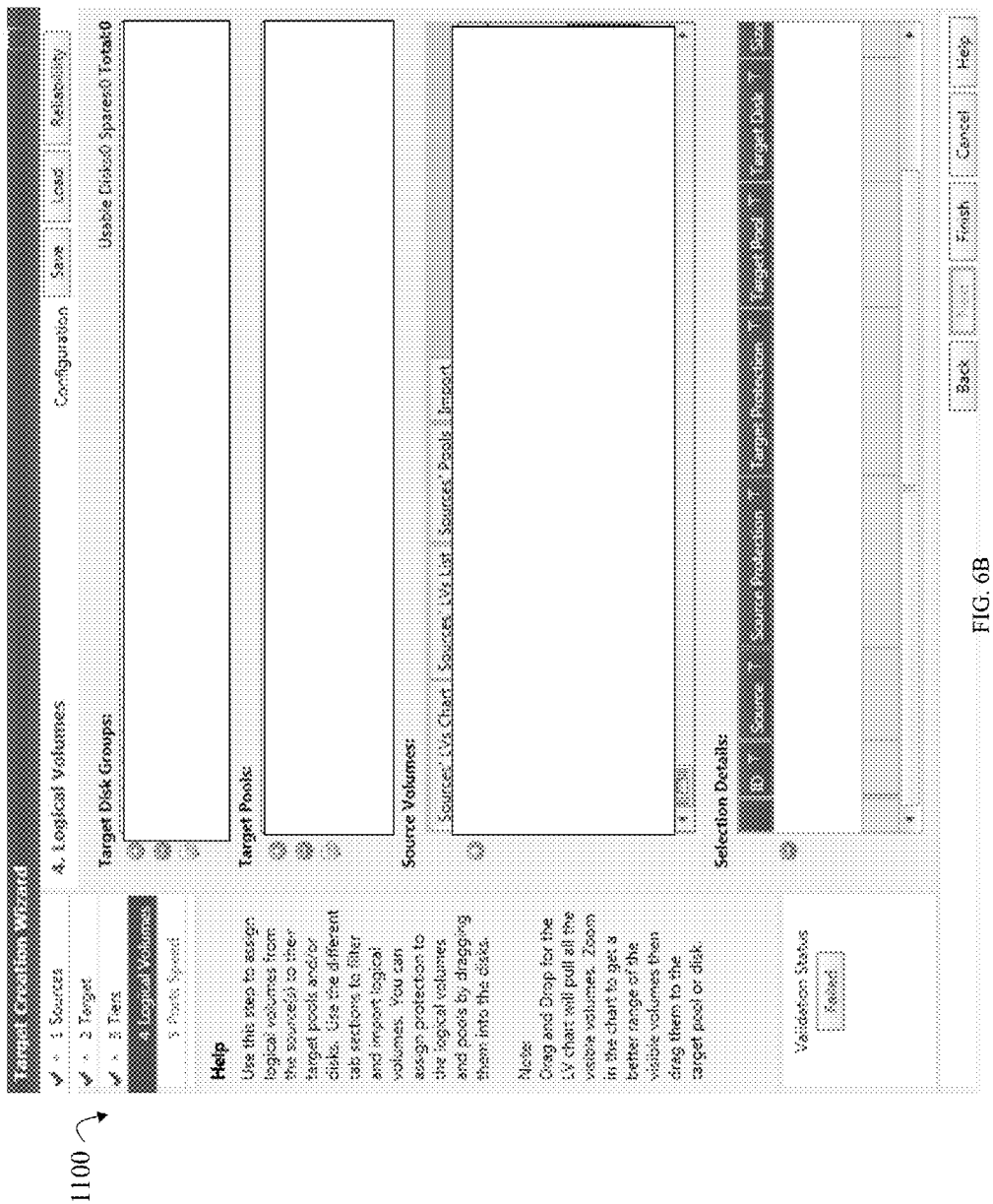
Figure 6C:
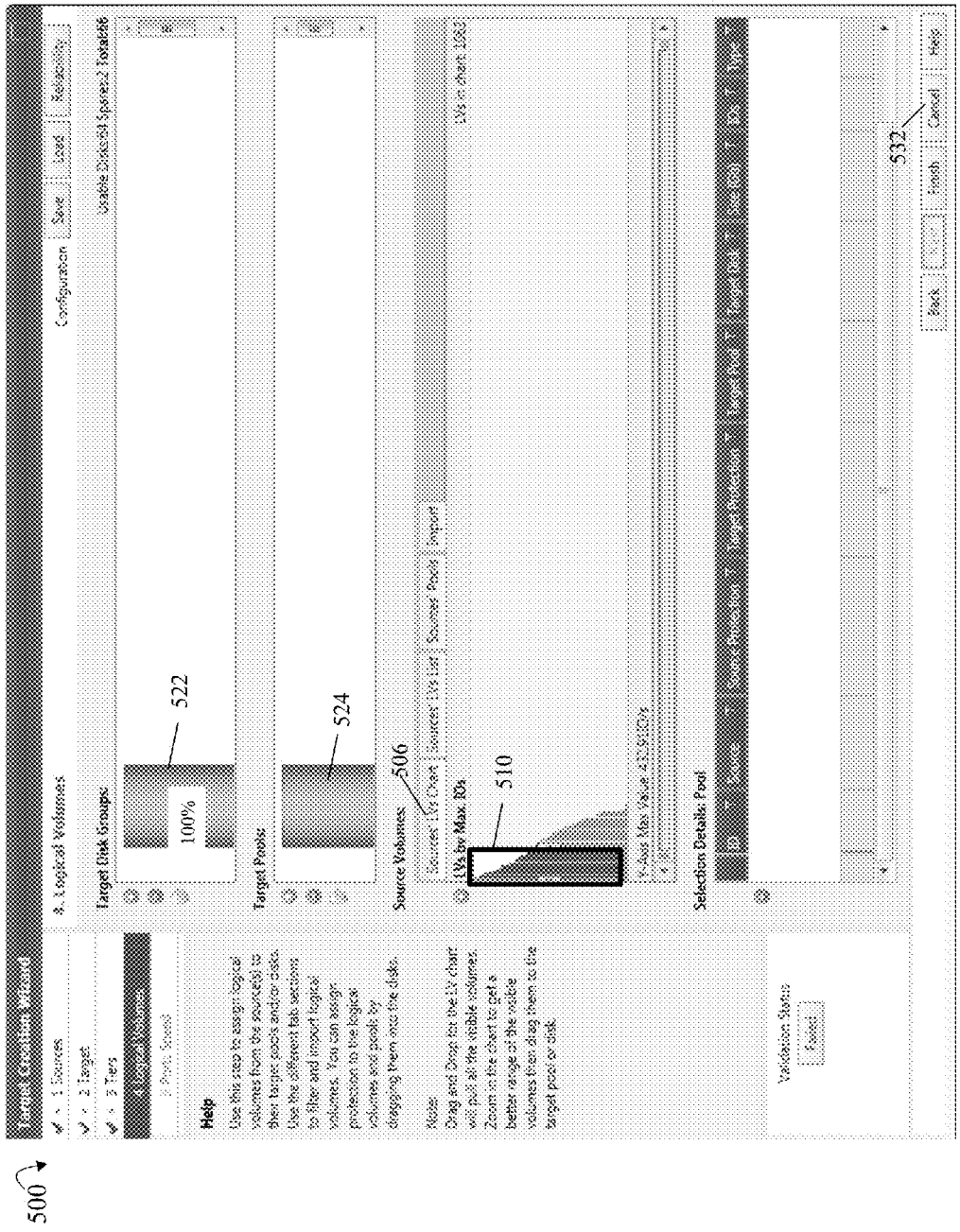

Referring back to FIG. 5, a user may select 330 to manually assign LVs to target pools or tiers rather than have the system automatically perform such processing as described above. For example, the user may select 330 and then select next button 324 in connection with thin devices. In response, the user may be presented with a screenshot as in FIG. 6B. With reference to FIG. 6C, the user may then manually commence forming a first target disk group 522 and target pool 524 through various menu selections and other user interactions. In the example 500, element 522 may represent a disk group of flash drives of a first EFD storage tier, and element 524 may represent a target pool including physical drives of the first EFD storage tier. The user may next view and sort the LVs based on a workload metric of the source system such as illustrated in 506. The information of 506 may be similar to that as described in connection with 470 of FIG. 6A. In this manner, the user may select a portion 510 of the LVs having the highest maximum number of I/Os per second and place these selected LVs of 510 in the pool 524 (e.g., such as by dragging and dropping with a selection or pointing device as described elsewhere herein and known in the art). By repeating processing as illustrated in connection with FIG. 6C, a user may manually configure the target disk groups by selecting the number and type of physical drives in each storage tier, manually configure the target disk group(s) of physical drives into one or more target pools, and manually select particular LVs for placement into the target pools or target disk groups.

Figure 6D:
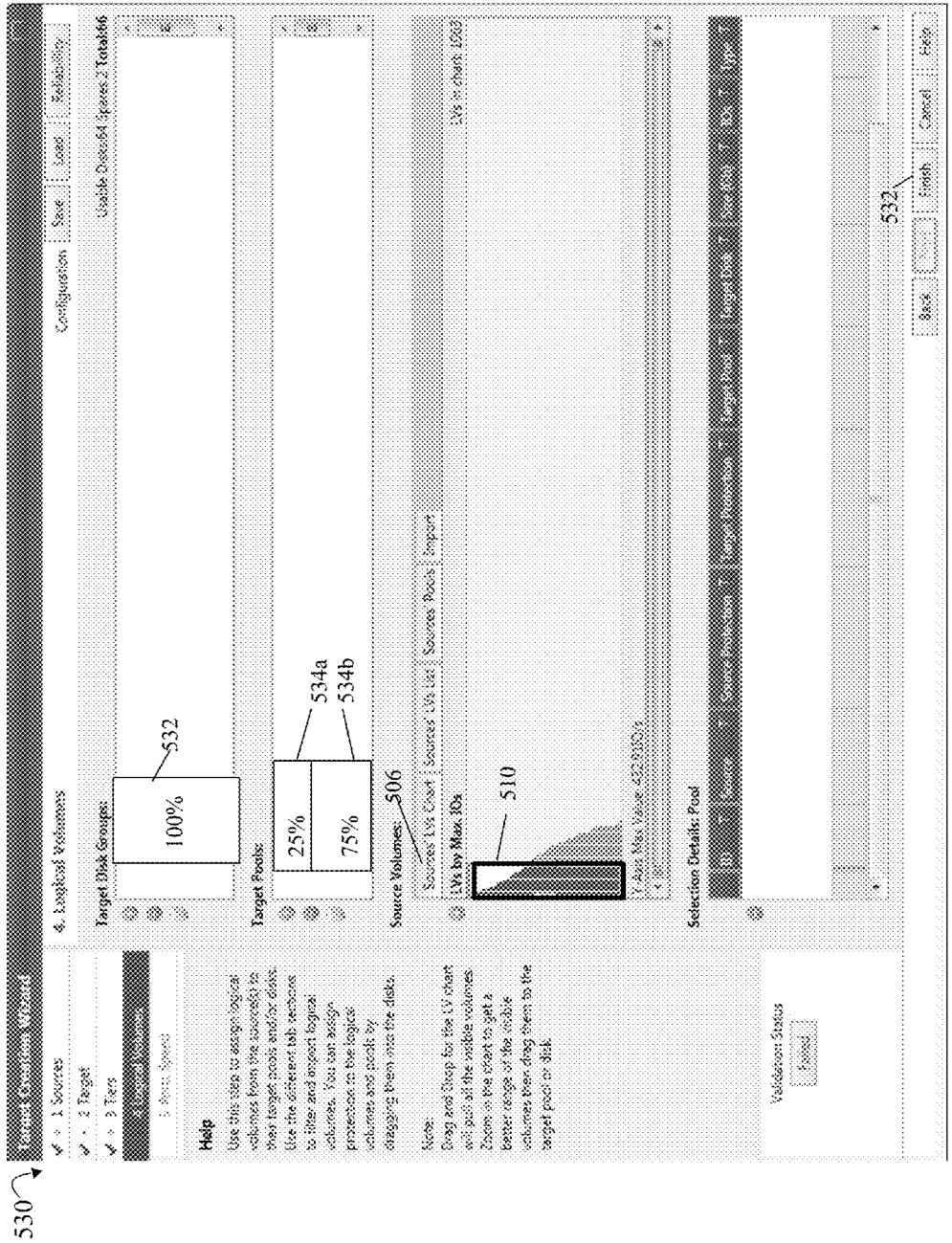

With reference now to FIG. 6D, shown is an example illustrating how the screenshot of FIG. 6C may be updated after placement of the selected LVs into the target pool 524. In response to placement or mapping of LVs to a suitable target pool and/or associated target disk group/storage tier, the percentages related to free or available storage capacity and used or consumed storage capacity may be automatically updated and displayed to the user. In this example in connection with thin devices, the target pools formed may be configured to use 100% of the capacity of the target disk group as illustrated by 532 (thus have 0% free or available). Element 534a may denote the amount of free storage of the storage pool and element 534b may denote the amount of consumed storage of the storage pool after mapping the selected LVs. It should be noted that in this example illustrating LVs which are thin devices, the thin devices may be mapped via dragging and dropping the LVs into the storage pool. In response, both the affected pool and tier may be updated (e.g., where the affected storage pool includes physical storage devices of the affected storage tier). If the LVs were thick rather than thin devices, the LVs may be mapped by dragging and dropping the LVs into the target disk group/storage tier directly (e.g., directly into target disk group) since a storage pool may not be configured for use with thick devices as noted elsewhere herein. In this manner, the user may be provided with visual feedback automatically regarding results of the LV mapping to physical storage. For example, if there was insufficient physical storage in the pool or tier for the selected LVs, the mapping operation may not be performed and the user may be notified by an error of the insufficiency in response to performing the above-mentioned drag and drop operation.

It should be noted that FIG. 6D provides a visual representation regarding percentages of used and/or free storage in terms of capacity. An embodiment may also provide for displaying similar percentages for target disk groups and/or target pools based workload percentages.

In an embodiment in accordance with techniques herein, mapping or placement of LVs into particular target pools or target disk groups of storage tiers may be performed automatically, manually, or a combination of the foregoing. The user interface may be used to view and/or modify an existing LV mapping and see the modeled result of that mapping in terms of defining an initial or starting target configuration.

It should be noted that although the figures and description provide information per LV and provide for initially placing an entire LV in a particular pool or disk group, the same techniques may be applied for use in a system having different levels of granularity for data portions less than a single LV. In this manner, information may be viewed for portions of a single LV and portions of a single LV may be distributed in multiple different target pools and different storage tiers. For example, an embodiment may allow a user to select data portions of an LV for placement in a particular storage tier or pool so that the level of storage granularity for which operations may be performed is for a data portion that is less than an LV (e.g., at the sub-LV or sub-LUN level).

Figure 6E:
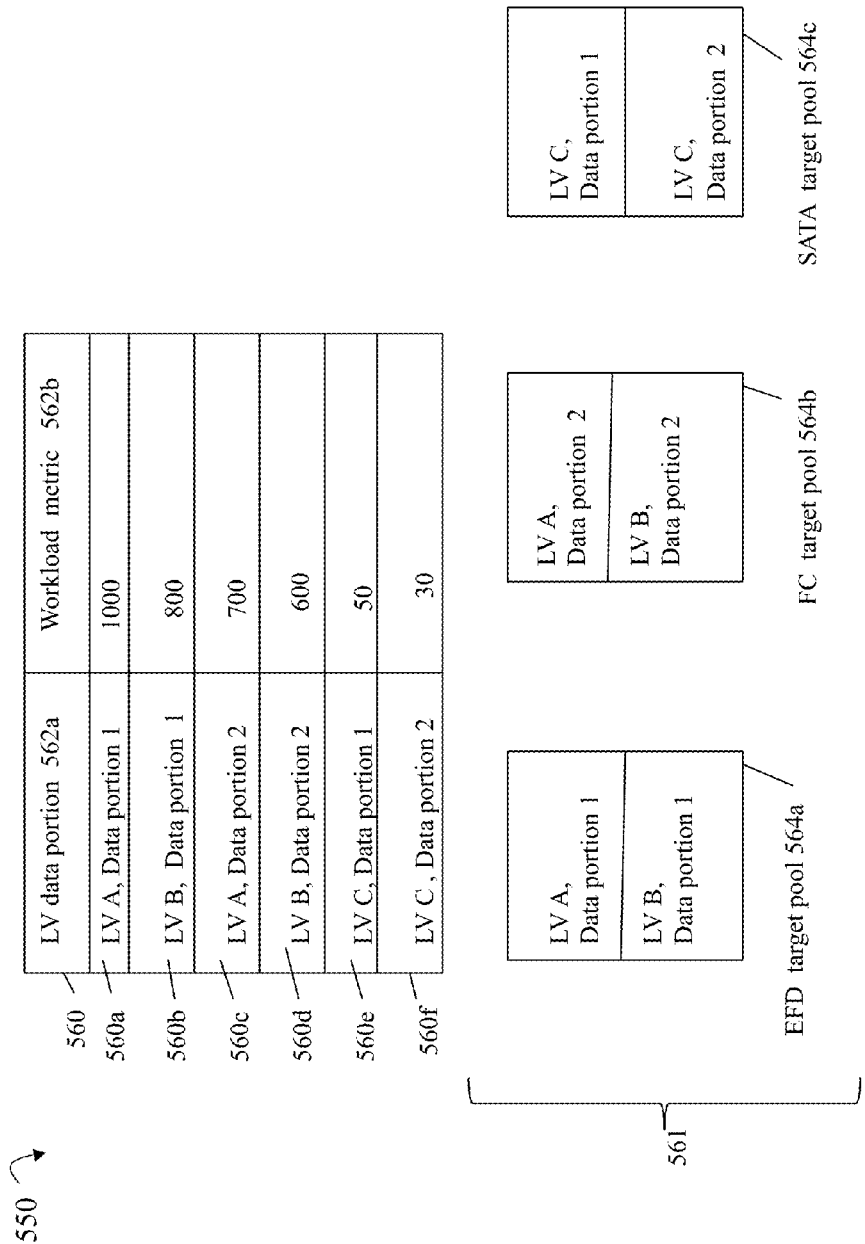

As a simple example, reference is made to FIG. 6E where table 560 includes a workload metric 562b determined for an LV data portion 562a. Each row 560 denotes the workload metric for a particular data portion of an LV. In this example, assume there are 3 LVs-LV A, LV B and LV C and that each data portion is the same size. For simplicity, each of the LVs A-C may have the same logical address range denoting capacity and each LV may be large enough to be partitioned into two data portions. Table 560 illustrates the LV data portions ranked in terms of decreasing workload metric 562b thereby denoting a sorting or ranking of data portions in order of decreasing work load. Thus, row 560a represents the highest ranked or most active data portion and the last row 560f represents the lowest ranked or least active data portion. In this manner, the higher that a data portion appears in table 560, the higher the workload or the more active the data portion relative to the other ranked data portions. Continuing with this simple example, assume that there are three target pools 564a-564c each of a different storage tier of physical drives. Element 564a represents the EFD target pool of the highest performing storage tier of EFD drives. Element 564b represents the FC target pool of the next or middle performance storage tier of FC drives. Element 564c represents the SATA target pool of the lowest performance storage tier of SATA drives. Each of the storage tiers may have the capacity to store two data portions from any LV. Based on the ranking of workload in 560, the data portions with the highest workload may be placed in physical devices of the highest available performance storage tier thereby resulting in the LV data portions initially distributed in 564a-564c as illustrated in 561. It should be noted that the foregoing is a simple example of how an LV may be partitioned into smaller data portions of granularity which may be mapped to different storage tiers and pools. In this manner such as with a thin or virtually provisioned device, data portions of a single LV may be distributed across multiple pools of different storage tiers. The foregoing may be performed automatically and/or manually to initially place the data portions of each desired LV in a particular physical drive. Consistent with the foregoing, an embodiment may also provide for viewing and sorting of workload such as viewing and sorting LV data portions based on the data in table 560 at the data portion granularity level as well as other processing described herein. For example with reference to FIG. 6A, in addition to sorting and viewing LVs ranked based on a particular workload metric, an embodiment may provide similar functionality for visual display and selection at the data portion level of granularity where there may be many such data portions (e.g. hundreds or thousands) in a single LV depending on the capacity of the particular LV and the size of each data portion. Functionality described herein may be included in an embodiment for one or more supported levels of granularity such as per LV and/or per data portion (which denoted a sub-LV level of granularity).

Once the user has completed the target configuration in connection with the automated and/or manual processing as described above, the user may select the user interface option denoting completion of the target configuration. With reference to FIG. 6, the user may denote completion of the target configuration process by selecting finish button 432.

With reference to FIG. 6D, the user may denote completion of the target configuration process by selecting finish button 532.

It should be noted that creating the target system may include modeling other internal mappings and associations between components of the target system configuration. For example, modeling the target system configuration may include automatically determining mappings between different front end components (e.g., which front end port is associated with which front end CPU, which front end components are located on which front end board, which portion of cache may be used in connection with various front end components) and mappings between different back end components (e.g., which back end port is associated with which back end CPU, which back end components are located on which back end board, which portion of cache may be used in connection with various back end components). Additionally, the modeling of the target system configuration may include determining which resources, such as which front end and back end components, may be used in connection with servicing I/O operations for a particular LV or data portion thereof stored on a particular physical device. The foregoing may be performed automatically as part of the processing by the tool. Such mappings may be based on the source systems utilized as may be adapted for use with the target system being simulated. Other embodiments may provide for manually modifying or specifying such mappings and associations.

It should be noted that although the above-mentioned target creation wizard provides an example of inputs that may be used in connection with creating a target configuration, those skilled in the art will appreciate that techniques herein may be performed using variations thereof. For example, one or more source systems may be selected as the collective "source configuration". The source configuration information may include logical devices or LVs and possibly other logical entities as described above, and the source configuration information may be configuration in use for actual data storage systems. However, the source configuration information used with techniques herein may not be configuration information for actual source system. Rather, the source configuration may be hypothetical and not actually relate to any implemented data storage configuration. The source configuration information also does not have to include logical devices or LVs. It may be, for example, that workload data used an input for use with techniques herein has workload data for each data portion without further aggregating data portions into other higher level logical constructs such as an LV including one or more data portions. In this case, the techniques herein may be utilized without any LVs or logical device entities. As another example, a source configuration in an embodiment may specify capacity information related to a size of a source system configuration device (that may be a logical device or a physical device) and such capacity information may be automatically translated or mapped to a logical volume by software processing the source configuration file.

Upon completion of the target configuration process, the system may now perform processing to model or simulate performance of the data storage system based on the target configuration. The performance modeling uses the workload data as collected/observed for the source configuration which is then used to simulate the workload for the target configuration. As will be appreciated by those skilled in the art, the modeling or simulation may provide for determining the simulated workload of different system components (e.g., such as physical devices and other described herein) by collectively aggregating various portions of workload information. For example, if a set of one or more LVs are placed or mapped in a particular target storage tier or target pool, the workload for the target storage tier or pool into which the LVs are placed or mapped is based on the aggregated workload of the set of LVs. Similarly, for embodiments which allow placement or mapping of data portions into a target storage tier or pool where the data portions may denote a level of storage granularity less than a single LV (e.g., such as in connection with thin or virtually provisioned devices), the aggregated workload of such data portions are collectively considered in connection with determining the simulated workload of the target storage tier or pool. For example, with reference back to FIG. 6E, the simulated workload of the EFD target pool 564*a* (and underlying physical devices of the pool) is based on the aggregated workload of LV A, data portion 1 and LV B, data portion 1. The simulated workload of the FC target pool 564*b* (and underlying physical devices of the pool) is based on the aggregated workload of LV A, data portion 2 and LV B, data portion 2. The simulated workload of the SATA target pool 564*c* (and underlying physical devices of the pool) is based on the aggregated workload of LV C, data portion 1 and LV C, data portion 2. Similarly, if each of 564*a-c* represented a placement of data portions on a single physical device (PD) of different storage tiers, the simulated workload would be simulated for each such PD based on the aggregated workload of the data portions having their data located on such PDs. As also described in more detail elsewhere herein, activity information may change over time for the LVs, data portions, and the like. Such updated or revised activity data may be based on a simulated data movement optimization whereby data portions are relocated between PDs of different storage tiers. In this manner, promotion and/or demotion of data portions may occur and may be simulated in an embodiment in accordance with techniques herein. As such data portions are relocated or moved between storage tiers, the simulated workload of the components, storage tiers, pools, and the like, may be updated. For example with reference back to FIG. 6E, if at a later point in time, a data movement optimization is performed which both demotes LV A, data portion 1 to the SATA target pool 564*c* and also promotes LV C data portion 2 to the EFD target pool 564*a*, the simulated workload for the EFD pool 564*a* (and underlying physical devices of the pool) is now based on the current aggregated workload of LV C, data portion 2 and LV B, data portion 1 and the simulated workload for the SATA target pool 564*c* (and underlying physical devices of the pool) is now based on the current aggregated workload of LV A, data portion 1 and LV C data portion 2. The simulated workload for the FC target pool 564*b* (and underlying physical devices of the pool) is based on any revised workload data for LV A data portion 2 and LV B data portion 2.

The workload or activity as related to the components in a data storage system configuration may be visually displayed. A utilization map is one example of such a visual display of workload impact on utilization per component in the data storage system such as for the modeled or simulated target configuration. What will now be described is one example of a visual display of workload in terms of a utilization map that may be used in an embodiment in accordance with techniques herein. For example, the utilization map may be used to visually display component level utilization in connection with a source configuration of a data storage system and a simulated or modeled target data storage system having the target configuration. Furthermore, as described more detail below, the utilization map may be used to visually represent other simulated changes made with respect to modeling aspects of the target data storage system. For example, subsequent to modeling the target data storage system at a first point in time, processing may be performed to simulate a data movement optimization that may be performed at a second point in time based on an updated workload at the second point in time for the LVs, and data portions thereof. The utilization map may be updated based on component level utilization subsequent to performing the modeled data movement optimization at the second point in time.

In connection with following description and FIGS. 7A, 7B, 8A and 8B, shown is one example of a utilization map that may be used to provide visualization of component level utilization. Additionally, other information may be optionally displayed in the utilization map with respect to a selected LV as also described.

Figure 7A:
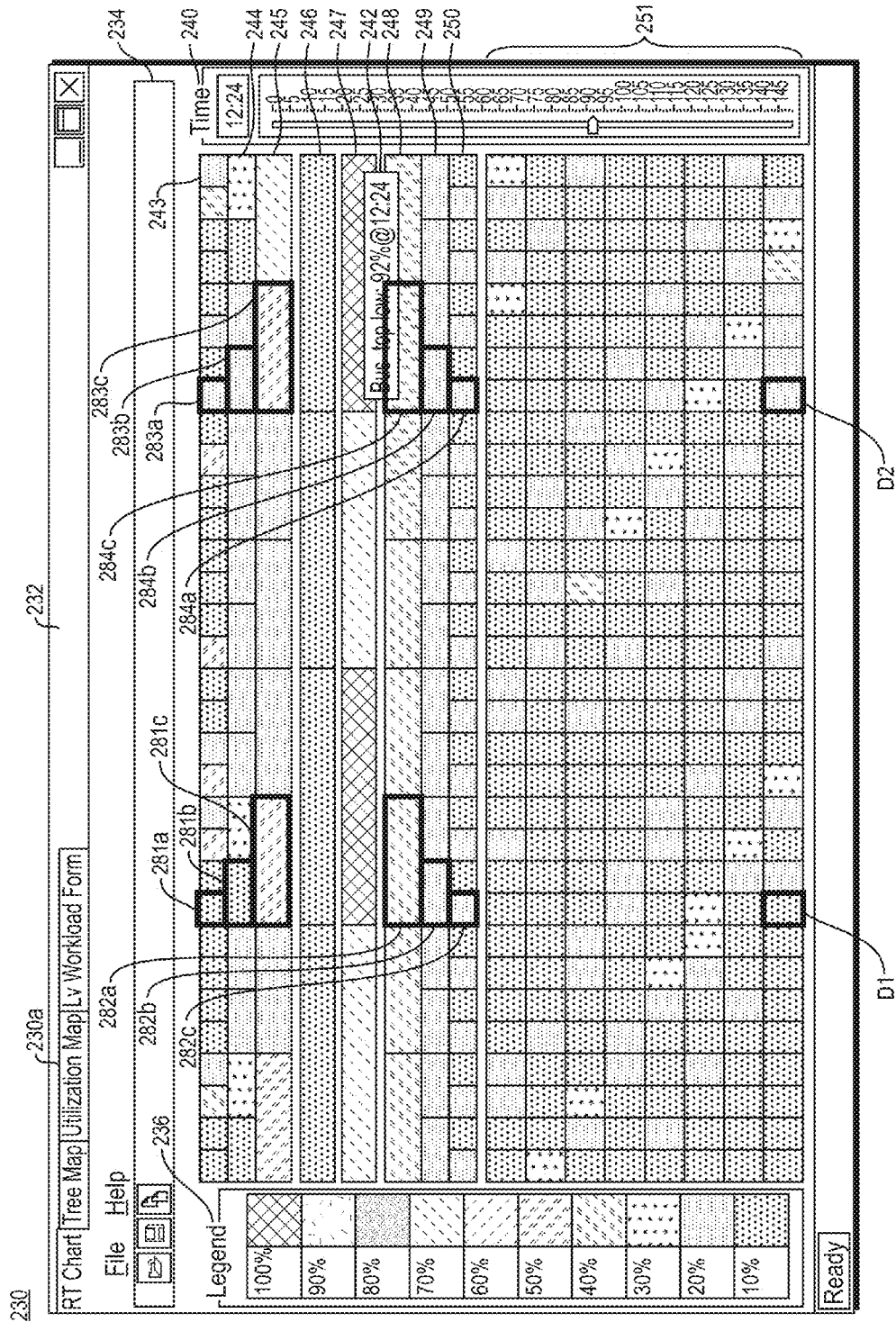
FIGS. 7A, 7B, 8A, 8B, 9, 10 and 11 illustrate examples of utilization maps as may be used in an embodiment in connection with techniques herein.
Figure 7B:
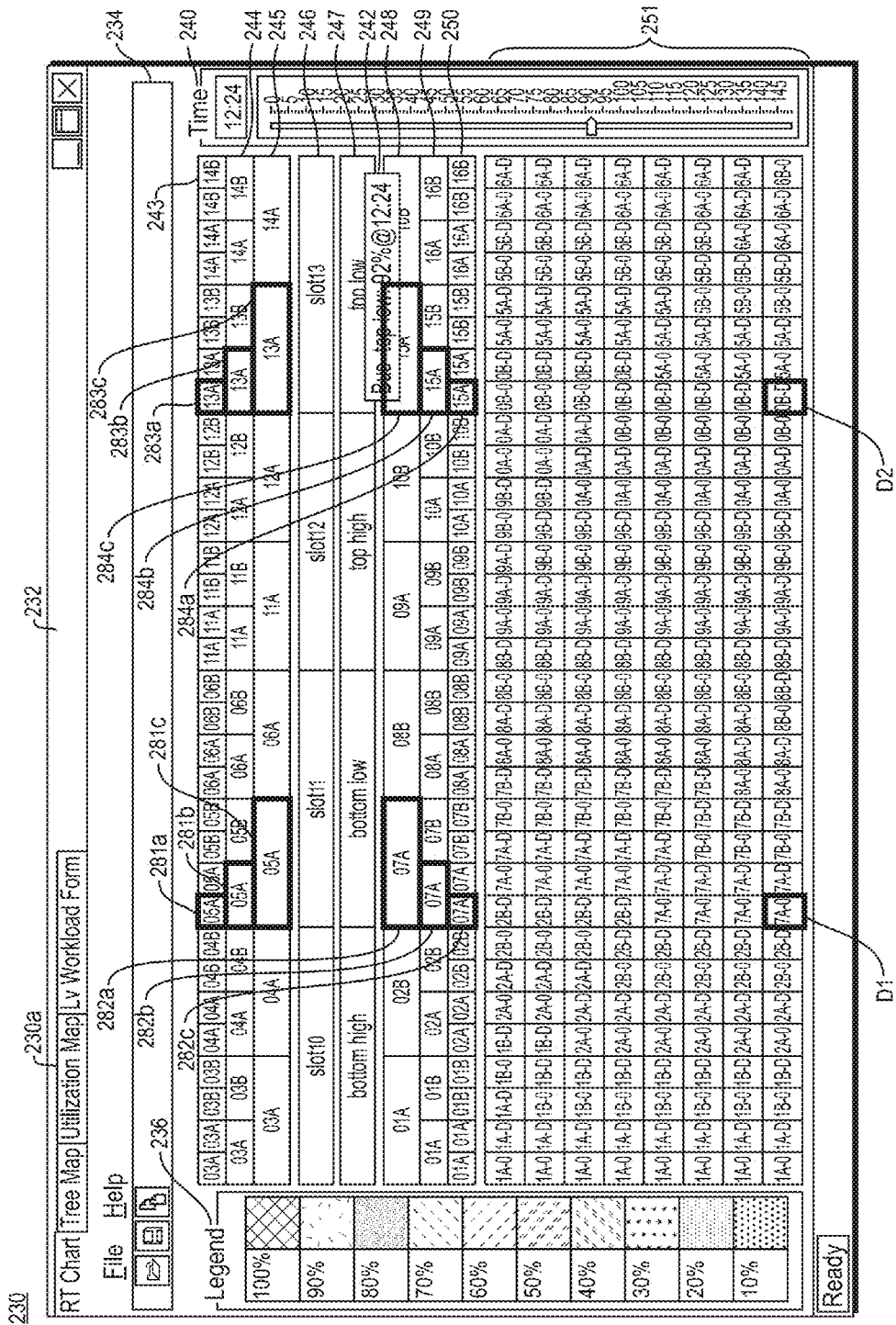
Figure 8A:
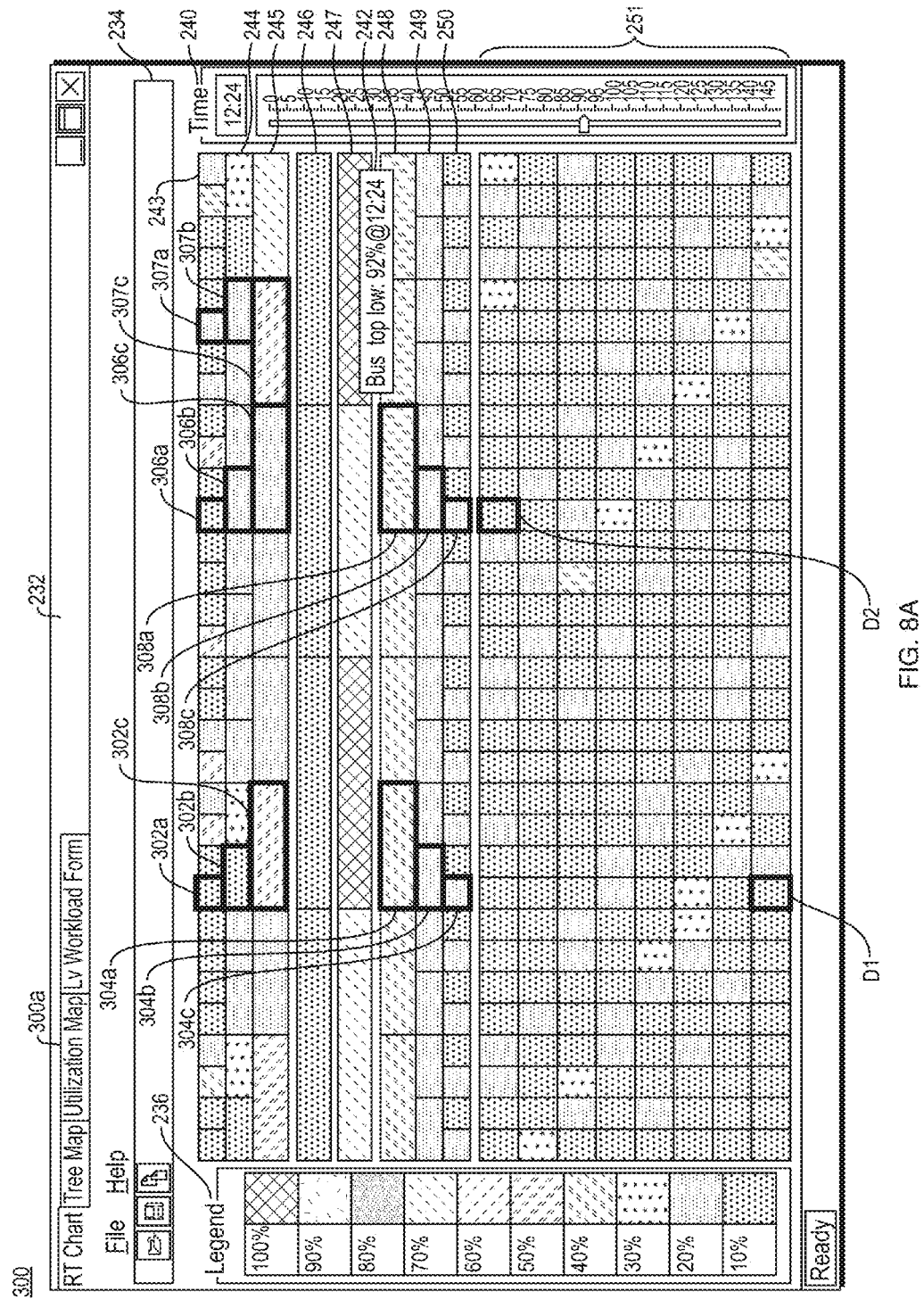
Figure 8B:
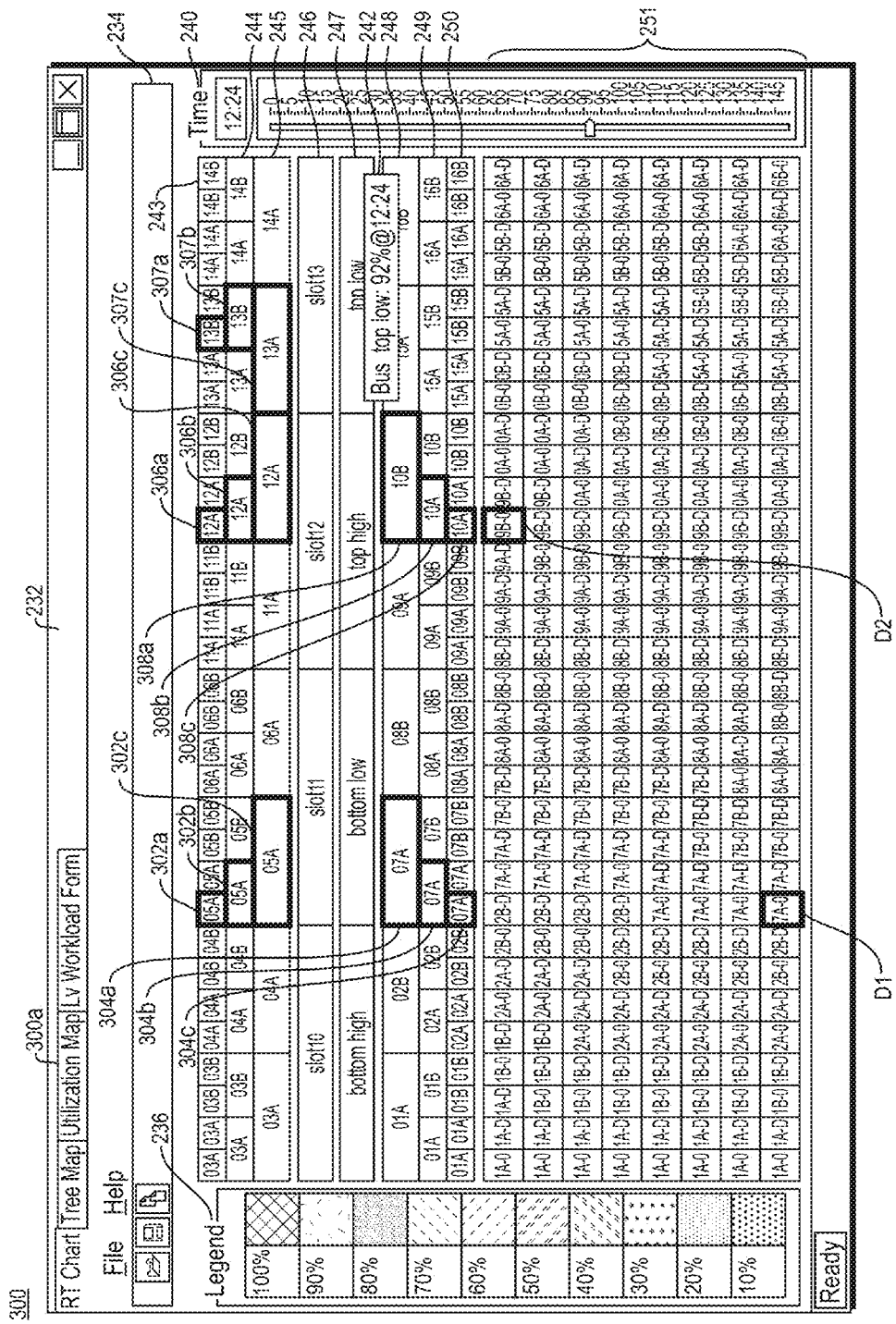

An embodiment may also provide for the display of utilization information for the selected LV. In one embodiment with reference to FIGS. 7A and 7B, the utilization information may be displayed in response to a user selection such as by selecting tab 230*a*. In actual implementation, information in FIGS. 7A and 7B may be combined into a single display such that the information of FIG. 7A illustrating shading is overlayed or viewed in combination with the text of FIG. 7B in commonly denoted portions to view the utilization information. In a similar manner to that as described for FIGS. 7A and 7B, in actual implementation, information in FIGS. 8A and 8B is combined into a single display such that the information of FIG. 8A illustrating shading may be overlayed or viewed in combination with the text of FIG. 8B in commonly denoted portions to view the utilization information. FIGS. 7A and 7B show a component analysis map screen 230 of an entire data storage system. The tool 504 may enable a user to view utilization of each component in a data storage system. The tool may provide the user with an option to view the utilization information in a map format as illustrated in FIGS. 7A, 7B and 8A, 8B as well as possibly other forms through the user interface. The mapped view of FIGS. 7A and 7B represents the maximum utilization of each component over all the timestamps (e.g. for an entire period of time) or per a particular timestamp (i.e. point in time). A title area 232 and action menu bar area 234 serve to respectively inform and allow the user to interact in conventional ways of Windows based software. The mapped view presents a way for a user to explore the utilization and potential problems of a data storage system. The map of 230 generally shows the utilization of each component in accordance with a legend of different visual indicators associated with different utilization percentages such as indicated by legend 236. For example, different components may be color coded in accordance with different colors associated with different utilization percentages (e.g. using red to identify over-used components (shown here in FIG. 7A as graphically coded due to lack of color drawings used herein). A timestamp area 240 allows the user to look at usage over any selected time.

Generally, regarding identification of components in the presented window of screen 230, the following applies for this example. Presented from top to bottom on screen 230 are:

area 243: front-end ports;
area 244: front-end CPUs;
area 245: front-end boards (i.e. the components on board to the bus)
area 246: memory or cache boards;
area 247: buses or fabric;
area 248: back-end boards;
area 249: back-end CPUs;
area 250 back-end ports; and
area 251: physical devices such as physical disks identified by physical volume id's. In a multi-tiered storage environment, the physical devices of 251 may collectively include storage devices of the different storage tiers (e.g., EFD, FC and SATA in a system having three storage tiers). In connection with the foregoing, front end ports, boards and CPUs may refer to a front end component of the data storage system such as an FA which receives I/Os from the host. Back end ports, boards, and CPUs may refer to those of a back end component such as a DA.

In connection with techniques herein for the currently selected LV, the utilization map may visually indicate one or more data storage system components used in connection with servicing I/O operations for the selected LV. For example, elements 281*a*, 281*b*, 281*c*, 282*a*, 282*b*, 282*c*, 283*a*, 283*b*, 283*c*, 284*a*, 284*b*, 284*c* and D1 and D2 may be displayed to visually indicate such components for the selected LV. In this case, the LV may be a logical storage volume for which a level of data protection is enabled. In this case, RAID-1 or mirroring is performed for the selected LV so that D1 denotes a first physical device upon which the LV data is stored and such data is mirrored on a second physical device denoted by D2. This LV is configured to have access through two front end or FA ports and two DA or backend ports. Elements 282*c*, 282*b*, and 282*a* may denote, respectively, the first DA port, DA CPU and DA board used in connection with servicing I/O operations for the selected LV. Elements 284*a*, 284*b*, and 284*c* may denote, respectively, the second DA port, DA CPU and DA board used in connection with servicing I/O operations for the selected LV. Elements 281*a*, 281*b* and 281*c* may denote, respectively, the first FA port, FA CPU and FA board used in connection with servicing I/O operations for the selected LV. Elements 283*a*, 283*b* and 283*c* may denote, respectively, the second FA port, FA CPU and FA board used in connection with servicing I/O operations for the selected LV.

This example is an exemplary case of an EMC Symmetrix Data Storage System. However, one skilled in the art will recognize the general mapping scheme and components may apply to any data storage system other than the exemplary case.

Returning to FIGS. 7A and 7B, when a cursor, pointer or other means of selection is moved over a component screen representation (e.g. example component screen representation 242 in general screen area 247), the utilization is shown presented on the screen for the user to read. In the present example, the Bus-top low component: is being used at 92% utilization at the time 12:24. This implies alarmingly high traffic and alerts a user of potential problem areas to address for the target or current system. It should be understood, that generally additional text messages and information of different type may also be displayed in response to such cursor movement. It should also be noted that the display of FIGS. 7A and 7B in an embodiment may further annotated with additional information for the selected LV and its associated components. For example, with respect to those components identified by D1, D2, 281*a-c*, 282*a-c*, 283*a-c* and 284*a-c*, additional information such as described above in connection with element 242 may automatically be displayed in response to selection of tab 230*a*. In other words, rather than have such information displayed in response to movement of the cursor or pointer for selection, such information may automatically be included in the display for those components of D1, D2, 281a-c, 282a-c, 283a-c and 284a-c for the selected LV.

Additionally and more generally, a user may be able to draw many conclusions by viewing the map of FIGS. 7A and 7B. For example, many disk drives, e.g. Drive 1A-0 are being under-utilized, 10% in the example, while others, e.g. Drive 9A-0 are being used at a good rate of about 40%. Thus, the map view of FIGS. 7A and 7B is also generally useful for determining utilization of each component in a system.

Referring to FIGS. 8A and 8B, shown is another example illustrating use of the utilization map in connection with a selected LV in accordance with techniques herein. The map of the example 300 of FIGS. 8A and 8B is similar to that as described above in connection with FIGS. 7A and 7B. As in the previous FIGS. 7A and 7B, in this example, the LV may be a volume for which a level of data protection is enabled. In this case, RAID-1 or mirroring is performed for the selected LV so that D1 denotes a first physical device upon which the LV data is stored and such data is mirrored on a second physical device denoted by D2. In the example of FIGS. 8A and 8B, three FA ports and associated components are designated as servicing the LV rather than 2 FA ports and associated components as illustrated in FIGS. 7A and 7B.

In connection with techniques herein for the currently selected LV, the utilization map of FIGS. 8A and 8B may visually indicate one or more data storage system components used in connection with servicing I/O operations for the selected LV. For example, elements 302a-c, 304a-c, 306a-c, 308a-c, and D1 and D2 may be displayed to visually indicate such components for the selected LV. Elements 304c, 304b, and 304a may denote, respectively, the DA port, DA CPU and DA board used in connection with servicing I/O operations for the selected LV when using the mirrored copy of the data stored on physical device D1. Elements 302a, 302b and 302c may denote, respectively, the FA port, FA CPU and FA board used in connection with servicing I/O operations for the selected LV when using the mirrored copy of the data stored on physical device D1. Elements 308c, 308b, and 308a may denote, respectively, the DA port, DA CPU and DA board used in connection with servicing I/O operations for the selected LV when using the mirrored copy of the data stored on physical device D2. Elements 306a, 306b and 306c may denote, respectively, the FA port, FA CPU and FA board used in connection with servicing I/O operations for the selected LV when using the mirrored copy of the data stored on physical device D2. Elements 307a, 307b, and 307c may denote, respectively, the third FA port, FA CPU and FA board used in connection with servicing I/O operations for the selected LV.

In a similar manner to that as described above in connection with FIGS. 7A, 7B and 8A, 8B, different and/or additional components may be visually indicated for a particular LV in accordance with the data protection of RAID level associated with the LV as well as other particulars of an embodiment that may vary with LV. For example, an embodiment may also highlight fabric or bus components (247), and/or global memory or cache components (246).

As described herein, an LV may be a thin device, or more generally, a logical device which is partitioned into a plurality of data portions where each of the data portions may be stored as a unit of granularity on any physical device. In this manner, individual data portions of the LV may be placed on physical devices of particular storage tiers depending on the dynamically changing workload of the individual data portions. In such an embodiment, the information displayed by the utilization map regarding components used in connection with servicing I/O operations for the selected LV may indicate such components for the multiple physical devices where all the LV data portions reside at a point in time. For example, with reference back to FIGS. 7A and 7B, assume that the currently selected LV has no RAID protection. D1 may denote a physical device of the EFD tier and D2 may denote a physical device of the SATA tier. The LV may have its data partitioned into two data portions with a first portion that has a high workload on D1 and a second data portion having a very low workload on D2. In this case, the displayed information of FIGS. 7A and 7B may identify the different physical devices of different storage tiers including the data portions for the selected LV at a first point in time. As described elsewhere herein, at a second point in time, the workload of the first and second data portions may change and the data portions may be promoted and/or demoted to other physical devices of different storage tiers depending on the current workload at the second point in time. Such a data storage movement optimization that is a promotion or demotion may be simulated. At this second point in time, the utilization map may include updated utilization rates, LV information, and the like, to reflect the results of the simulated data movement optimization on the displayed configuration. Thus, the utilization map component-level utilization rates may reflect a simulated data movement optimization for any number of data portions subject to promotion or demotion. Additionally, an embodiment may provide for further display of information regarding a selected LV as also described above in connection with FIGS. 7A,B and 8A, B.

Figure 9:
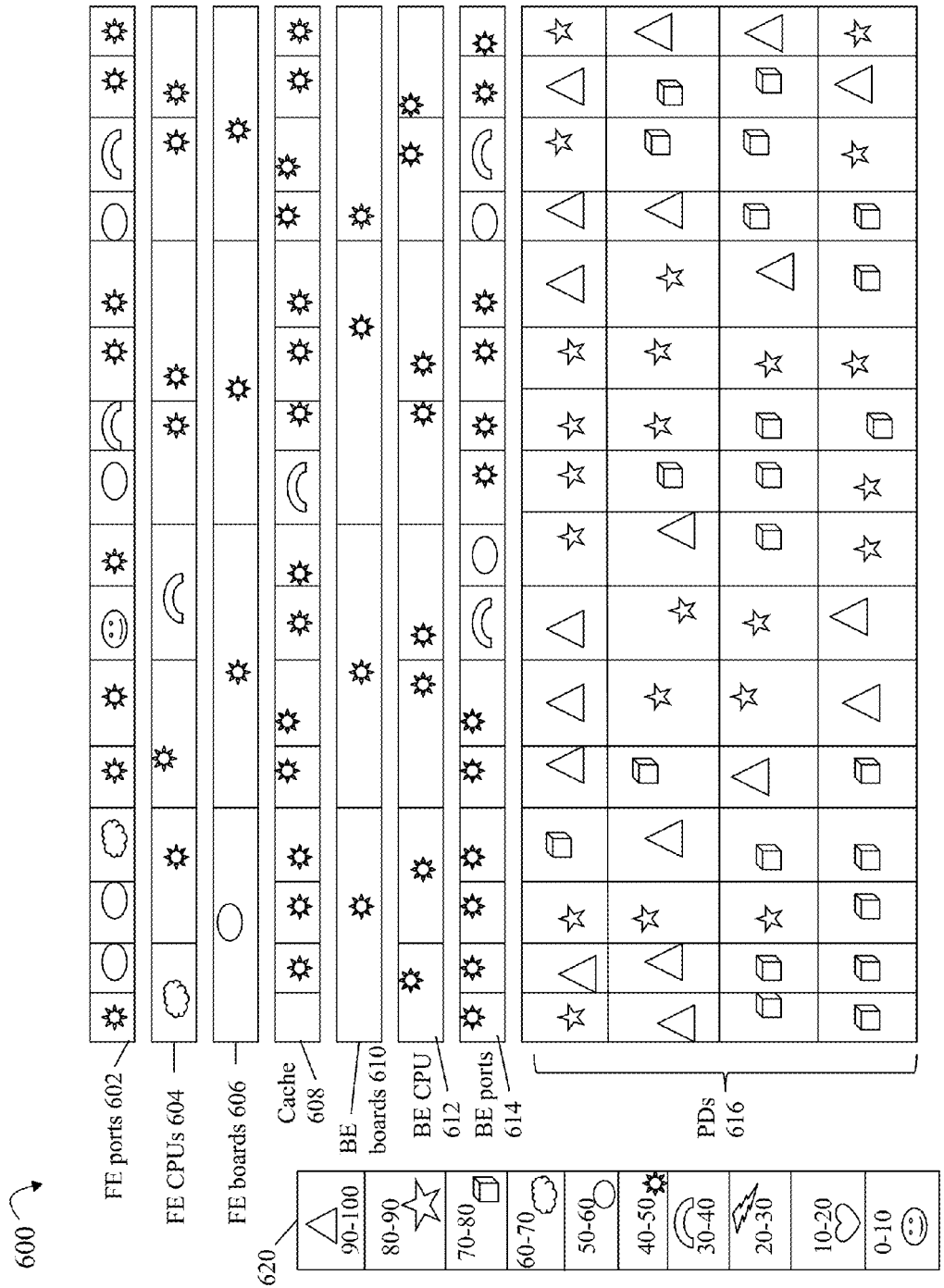

What will now be described is an example of how the utilization map may be used to provide a visual display of resulting workload or activity information in an embodiment in accordance with techniques herein. It should be noted that the utilization maps in following figures with this example may represent a simplistic illustration of a utilization map omitting many details such as described above and illustrated in FIGS. 7A, 7B, 8A and 8B. As a first step, a first utilization map may be displayed for a source data storage configuration such as based on a single one of the source configurations described in connection with FIG. 3. FIG. 9 is an example of such a first utilization map including a legend and the different components as described in connection with FIGS. 7A-8B. The example 600 includes a legend 620, FE ports 602, FE CPUs 604, FE boards 606, cache 608, BE boards 610, BE CPUs 612, BE ports 614 and physical drives or devices (PDs) 616. The PDs 616 may include physical storage media of one or more storage tiers as described herein. In this example, the source configuration may include PDs which are all a single tier of rotating drives such as SATA drives. The LVs may be thin devices. The example 600 includes notations regarding a percentage of utilization for the various components in accordance with the visual indicators denoted in the legend 620. Based on the visual indicators for the PDs 616, the PDs have high utilization of 70% or greater for all PDs. The customer currently has the source data storage system configuration with the utilization as illustrated in FIG. 9. The customer decides that a new data storage system is needed due to the heavy workload. The new data storage system may be modeled or simulated using techniques herein as the target data storage system configuration allowing the customer to see the simulated or modeled target data storage system activity or performance prior to actually physically employing such a target system. In accordance with techniques herein, the target creation wizard (e.g., FIGS. 3-6D) may be used to create the new data storage system configuration as the target data storage system configuration to be modeled or simulated. Once the target data storage system configuration has been completed, modeling or simulation of the target system may be performed whereby the customer is able to see the simulated or modeled performance of target system in accordance with the workload data as may be previously acquired for the source system. The utilization map is one way in which this simulated or modeled performance of the target system may be visually displayed to the user.

Figure 10:
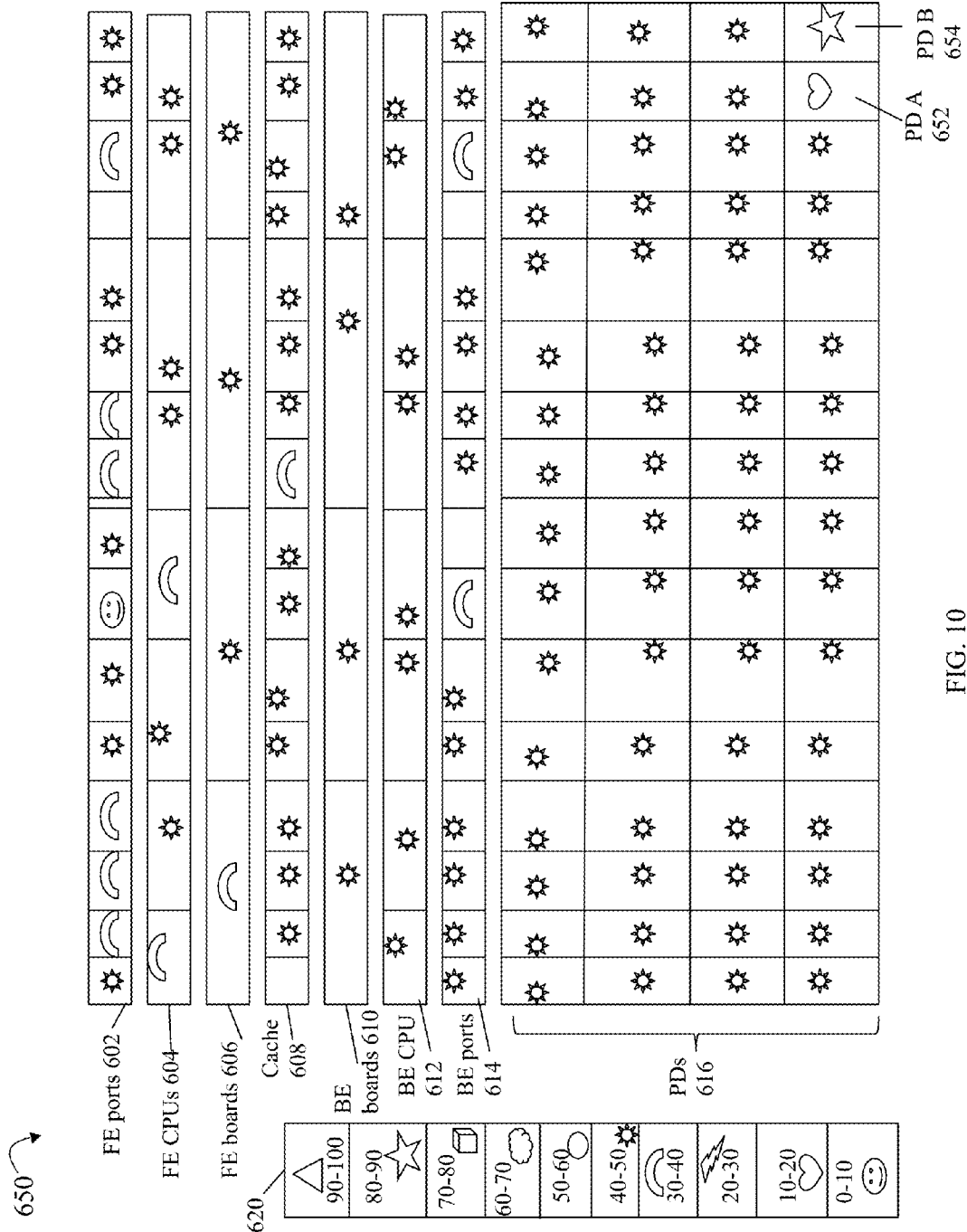

In this example, the target system may include three storage tiers (e.g., EFD, FC and SATA tiers) of thin device LVs as illustrated in connection with FIGS. 3-6D having a modeled performance as illustrated in connection with the second utilization map of FIG. 10. The example 650 illustrates the resulting simulated performance for the target data storage system using the workload for the various LVs, and data portions thereof, previously obtained for the source system. As can be seen, the utilization of the PDs 616 has decreased. FIG. 9 illustrates all PDs 616 having utilizations at or above 70%. With the target configuration now having the additional higher performing storage tiers, FIG. 10 illustrates that the PDs 616 containing the data of the LVs based on the target configuration all have utilization between 40-50% except for the PD A 652 and PD B 654. PD A 652 may be an EFD drive and PD B 654 may be a SATA rotating disk drive.

Software may be used to now further model or simulate a data movement optimization and resulting performance of the target data storage system subsequent to this data movement. Based on analysis of the current workload of the PDs 652, 654 of the modeled target system, the data storage optimizer may perform its evaluation regarding what data portions to promote and/or demote. In this example, the optimizer may determine that a first set of one or more data portions currently stored on SATA drive PD B 654 have a much higher workload than a second set of one or more data portions currently stored on EFD drive PD A 652. As a result, the data movement optimization may include promoting the first set of data portions currently stored on SATA drive PD B 654 to the EFD tier and place the first set of data portions on PD A. Additionally, the data movement optimization may include demoting the second set of data portions currently stored on EFD drive PD A 652 to the SATA tier and place the second set of data portions on PD B. The revised workload of the PDs and other component subsequent to this modeled data movement optimization may be determined and the resulting utilization map reflecting the performance of the components may be viewed. As will be appreciated by those skilled in the art, the data movement optimization simulated does not have to move all data portions currently stored on the PDs 652 654 where the data portions may be belong to multiple different LVs. Rather, the data storage optimizer may select a subset of data portions on a single PD which may have a significantly high or low workload, respectively, for promotion or demotion.

Figure 11:
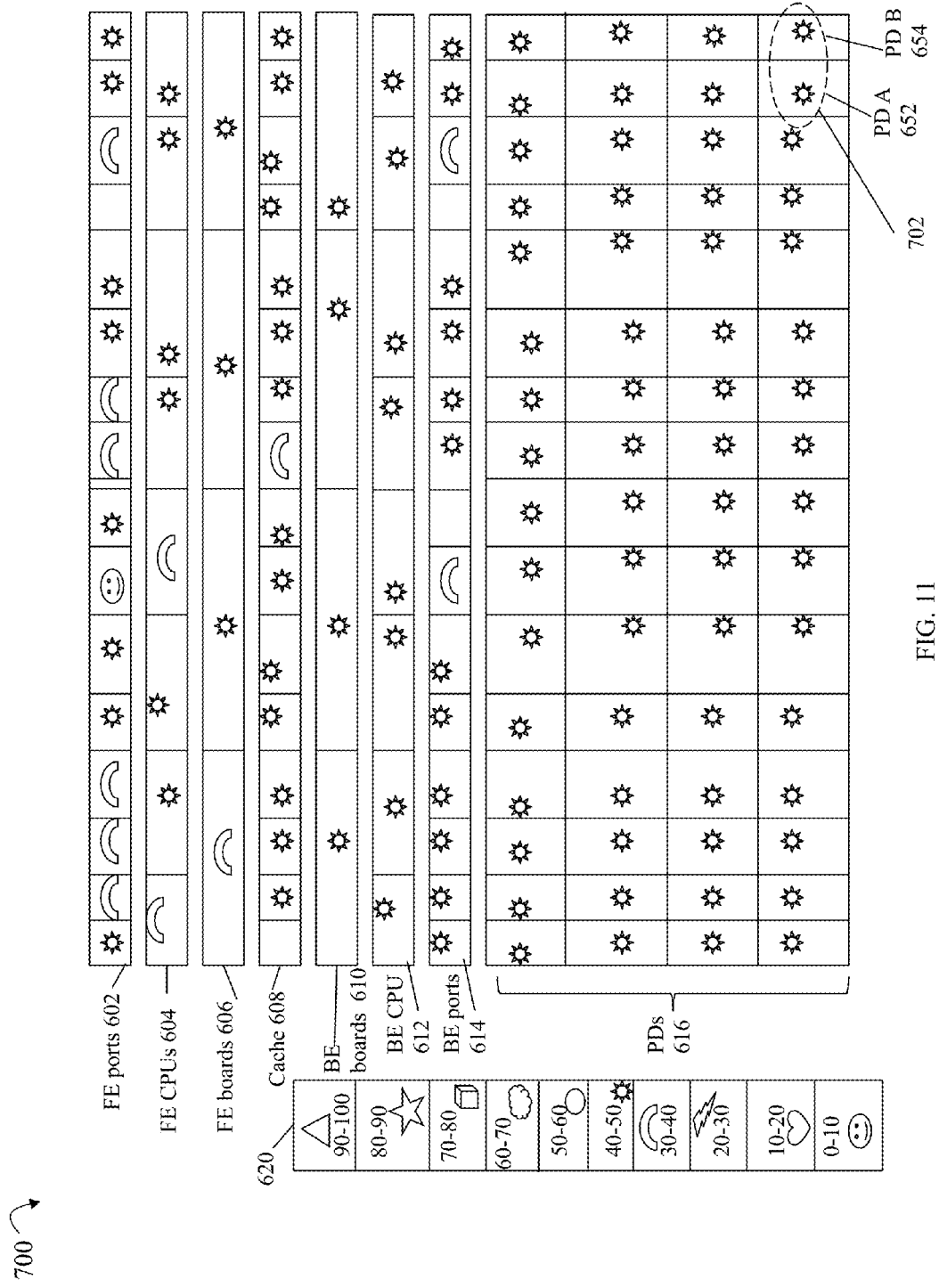

FIG. 11 is an example illustrating a third utilization map visually showing the component level utilization for the target data storage system subsequent to performing this data movement optimization. In the example 700, element 702 denotes the modeled revised utilizations for PD A 652 and PD B 654 as a result of the simulated data movement optimization. In this case, the data movement optimization resulting in further increased utilization of the EFD drive PD A 652 and decreased utilization of the SATA drive PD B 654. In a similar manner, further simulation and modeling of the target data storage system may be repeatedly performed based on revised workloads of the data portions at subsequent points in time. For example, for a revised workload of the data portions at a second point in time, the data optimizer may determine a second data movement optimization which may be modeled or simulated. Additionally, calculations may be performed to determine a fourth utilization map based on the modeled second data movement optimization. Thus, techniques herein may be used to provide a user with a means of a visual indication regarding modeled performance of the data storage system due to data storage configuration changes and also data storage movement optimizations. It should be noted that the data movement optimization may be performed based on revised or updated workload data used as a further modeling or simulation input. For example, the activity level of particular data portions may increase or decrease based on different sets of workload data corresponding to the changing workload in connection with data portions in a data storage system.

An embodiment may also include functionality to visually display information regarding a selected logical device, such as a selected LV, regarding the percentage of workload for the LV partitioned among the various storage tiers. In a manner similar to that as described herein with a utilization map, such information for a selected LV may be displayed at various points in time in the simulation and modeling. For example, such information may be viewed prior to performing a first data storage movement optimization and then subsequently after performing a data storage movement optimization to visualize the results of performing the simulated or modeled data storage movement optimization.

Figure 11A:
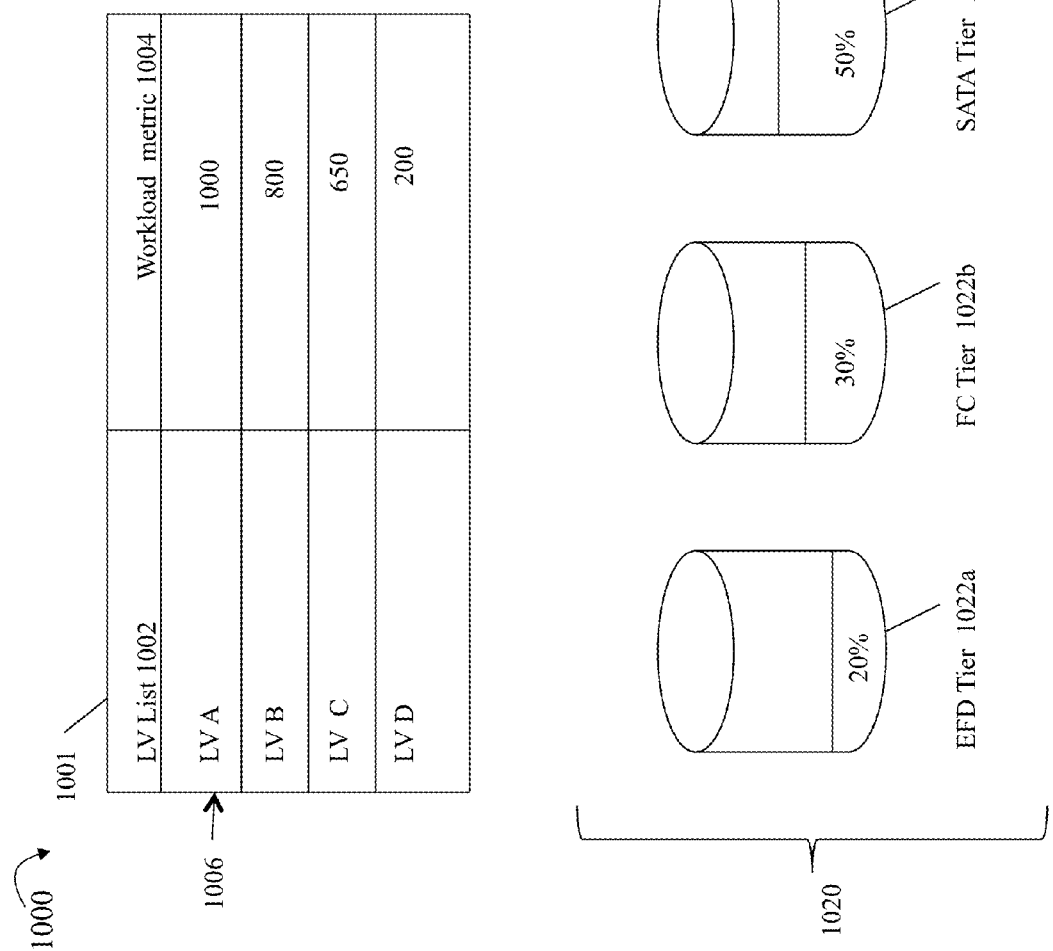

Referring to FIG. 11A, shown is an example 1000 of a user interface that may be displayed at a first point in time in connection with techniques herein. The example 1000 illustrates information that may be included in a screenshot displayed prior to performing a data storage movement optimization such as after initial placement of data portions and/or LV data in target storage tiers of a simulated or modeled target configuration. The table 1001 includes an LV list 1002 and values for a workload metric 1004. The table 1001 includes a row for each LV in the list whereby the row includes an identifier for the LV in 1002 and denotes the LV's corresponding workload metric 1004. Element 1004 is generally labeled a workload metric to represent any suitable workload metric that may be used in an embodiment. Examples of such workload metrics (e.g., response time, I/O throughout, and the like) are described elsewhere herein. A user may select 1006 a row from the table 1001. In response to the selection 1006, the interface may be updated to display information of 1020 representing the percentage of workload for the selected LV across the storage tiers as may be included in the modeled target system configuration. In this example, there are three storage tiers—EFD 1022a (consisting of flash drives), FC 1022b (consisting of rotating FC disk drives) and SATA 1022c (consisting of rotating SATA disk drives) whereby the tiers may be ranked from highest or best performance tier to lowest performance tier as EFD, FC and SATA. LV A has been selected via 1006 and it currently has the largest workload of all LVs in the system. Element 1020 may illustrate visually the percentages of LV A's workload as distributed across the three storage tiers included in this exemplary target configuration. Prior to performing any data storage movement optimizations, 20% of LV A's workload is in the EFD tier 1022a, 30% of LV A's workload is in the FC tier 1022b, and 50% of LV A's workload is in the SATA tier 1022c.

The data storage optimizer may perform an evaluation to determine one or more data movement optimizations that may be performed, for example, to relocate active data portions of LV A having the highest workload to the EFD tier 1022*a*. In this case, the data movement optimizer may model the data movement by moving or promoting such active data portions of LV A having perhaps the highest workload of all data portions on the system from the FC tier 1022*b* and the SATA tier 1022*c* to the EFD tier 1022*a*.

Figure 11B:
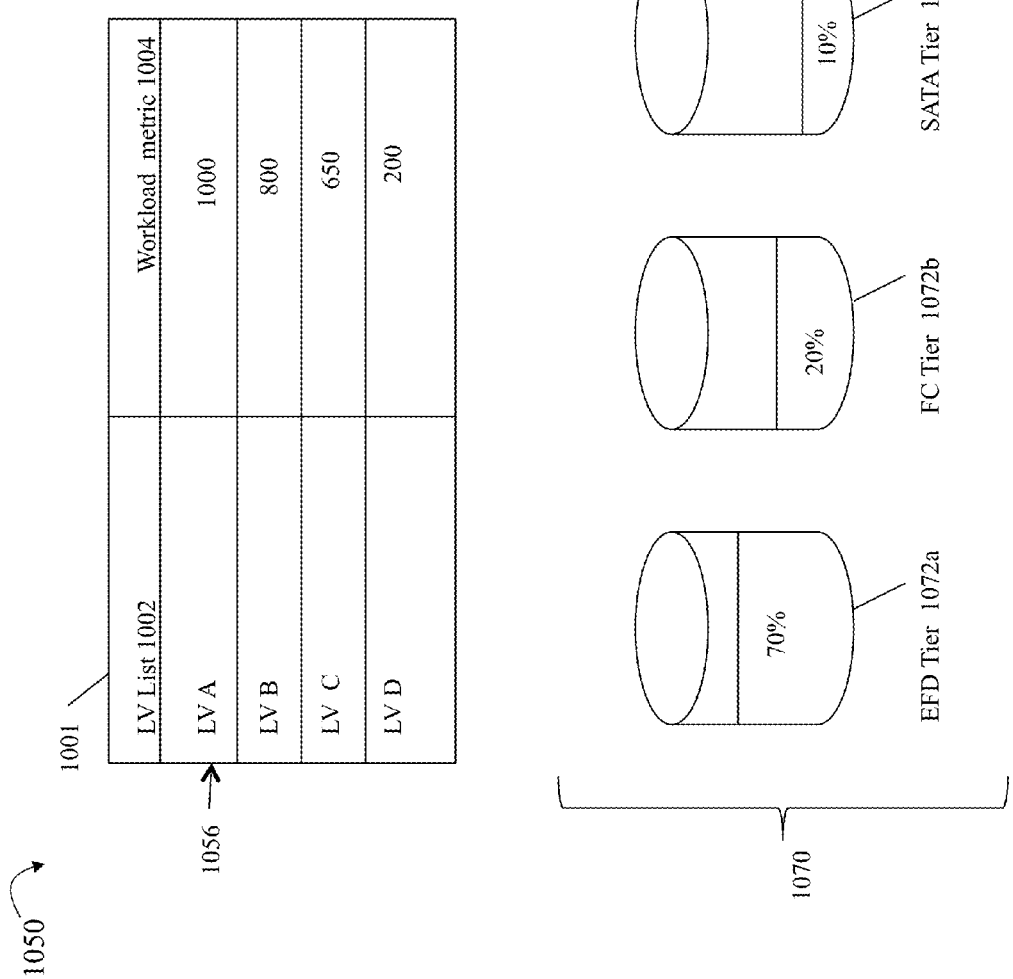

After the modeled data movement optimization has been completed with reference now to FIG. 11B, shown is a example 1050 of a user interface that may be displayed at a second point in time in connection with techniques herein. The table 1001 including a list of LVs and associated workload information may be displayed and a user may select 1056 LV A from the list. In a manner similar to that as described above, element 1070 illustrates information that may be displayed responsive to selecting 1056 LV A. Element 1070 may illustrate visually the percentages of LV A's workload as distributed across the three storage tiers included in this exemplary target configuration after performing data storage movement optimizations. As a result of the data storage movement optimizations, 70% of LV A's workload is in the EFD tier 1072*a*, 20% of LV A's workload is in the FC tier 1072*b*, and 10% of LV A's workload is in the SATA tier 1072*c*. As represented in 1070, the simulated data storage movement optimization has placed the most active data portion(s) of LV A in the highest performing tier so that 70% of LV A's workload (e.g., as may be measured in terms of I/O operations per unit of time, or any other suitable metric) resides in the EFD tier 1072*a*. It should be noted that the percentages relate to the aggregated workload for all of LV A's data portions in each tier 1072*a*, 1072*b* and 1072*c*. The display 1070 does not provide a visual indication regarding the number or amount of LV's data portions located in each tier but rather relates to the activity or workload level which may be concentrated in a single data portion or spread across any number of data portions.

Figure 12:
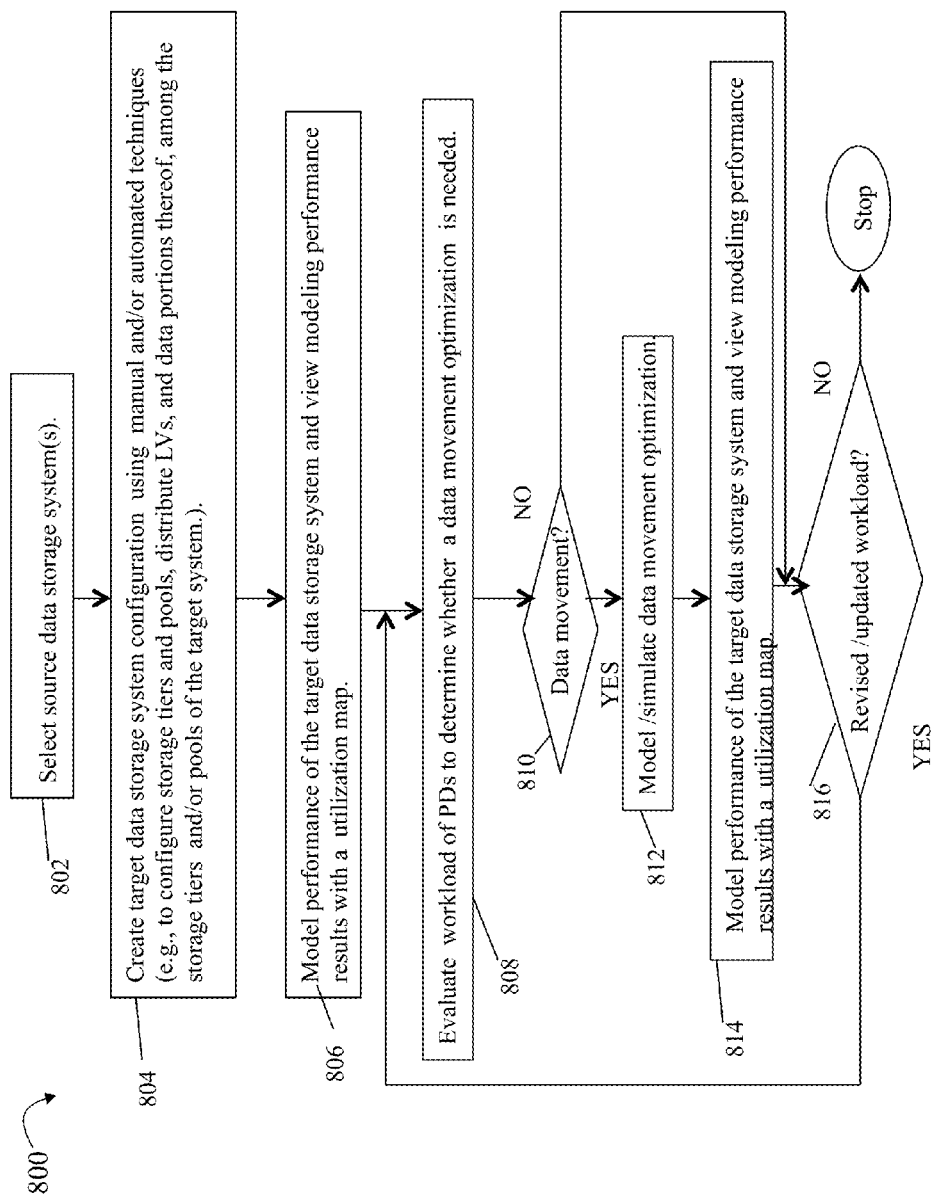
FIG. 12 is a flowchart of processing steps as may be performed in an embodiment in accordance with techniques herein.

Referring to FIG. 12, shown is a flowchart of processing steps that may be performed in an embodiment in accordance with techniques herein. The flowchart 800 summarizes processing steps as described above. It should be noted that the processing steps outlined in the flowchart 800 include steps which may be performed as a combination of user interactions and/or system processing. In step 802, one or more source data storage systems are selected such as described in connection with FIG. 3. In step 804, the target data storage system configuration is created. This is described above, for example, with reference to FIGS. 3-6D. Step 804 may include using manual and/or automated techniques to configure the storage tiers for thick and/or thin devices, and to distribute LVs, and data portions thereof, among the storage tiers of the target system. At step 806, the workload and performance of the target data storage system is modeled. The modeled performance results may be viewed using a utilization map. At step 808, the workload of the PDs, and data portions thereof, may be evaluated to determine whether a data movement optimization is needed. At step 810, a determination is made as to whether a data movement optimization is needed. It should be noted that step 810 may be performed, for example, by the data storage optimizer in performing an evaluation of whether to perform a simulated data storage movement optimization based on the modeled target data storage system. If step 810 evaluates to no, control proceeds to step 816. If step 810 evaluates to yes, control proceeds to step 812 to simulate or model the data movement optimization. At step 814, the performance of the target data storage system is modeled based on the revised state subsequent to the data movement optimization of step 812. Step 814 may include viewing the modeled performance results with a utilization map. At step 816, a determination is made as to whether there is revised or updated workload information to be considered for further modeling. If not processing stops. Otherwise, step 816 evaluates to yes and control proceeds to step 808. It should be noted that the flowchart 800 provides for repeatedly simulating data movement optimizations as may be based on revised and changing simulated workload or activity data and accordingly modeling the results of such optimizations. The performance results of the modeled system in terms of component level utilization may be observed in connection with a utilization map.

It should be noted that although processing may stop if step 816 evaluates to no, an embodiment may alternatively have data processing return to step 802 to proceed with selection of one or more new source system(s), or step 804 to proceed with creating additional target system configurations for a currently selected set of one or more source systems (from a previously executed step 802).

As will be appreciated by those skilled in the art, a user may enter inputs into a system where the code performing techniques herein resides on the same system. Alternatively, other suitable embodiments may include the user entering inputs for use with techniques herein on a first system, such as a first computer system, which then transmits the inputs for use with code performing techniques herein that may reside in a second different system, such as a second computer system. The first and second computer systems may be, for example, remotely located from one another so that they communicate via a network connection such as over the internet.

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method of simulating a target data storage system comprising:
   receiving a source configuration including a first logical device;
   receiving first activity data representing workload for the source configuration, said first activity data including I/O workload for a first data portion and a second data portion of the first logical device;
   creating a target data storage system configuration that models a configuration of one or more target data storage systems including a plurality of storage tiers comprising a first storage tier and a second storage tier, said creating including mapping first data portions of the first logical device to at least two storage tiers of the plurality of storage tiers of the target data storage system configuration in accordance with criteria including a data portion workload of each of the first data portions and a first data protection level denoting a specified RAID level for the first logical device, wherein physical devices of each of the at least two storage tiers are configured with a RAID-level that is at least the specified RAID level;

modeling performance of the target data storage system configuration, said modeling performance including determining a simulated workload for components of the target data storage system configuration based on the first activity data;

displaying, in a user interface, a utilization map indicating component level utilizations of components of the target data storage system configuration based on the simulated workload;

simulating a data movement optimization that moves data between two of the plurality of storage tiers within the one or more target data storage systems modeled in accordance with the target data storage system configuration; and after performing said simulating the data movement optimization, displaying, in the user interface, a second utilization map indicating updated component level utilizations of the components of the target data storage system configuration which have been revised to model the data movement optimization simulated for the target data storage system configuration.

2. The method of claim 1 wherein each of said utilization map and said second utilization map provide a visual indication in terms of percentage of utilization for each of said components.

3. The method of claim 2, wherein said components include at least one front end component port, at least one front end component processor, at least one front end component board, at least one back end component port, at least one back end component processor, at least one back end component board, at least one portion of cache, and a plurality of physical storage devices.

4. The method of claim 1, wherein the data movement optimization includes storing the first data portion of the first logical device on the first storage tier and storing the second data portion of the first logical device on the second storage tier, said first data portion having an I/O workload higher than said second data portion, said first storage tier being a higher performance tier than said second storage tier, and wherein the source configuration includes configuration information for one or more source data storage systems and includes information about a plurality of logical devices of the one or more source data storage systems, and wherein creating the target data storage system configuration includes mapping each of said plurality of logical devices to one or more physical storage devices.

5. The method of claim 4, wherein said mapping includes mapping said each logical device to any of: one of the plurality of storage tiers of physical storage devices and a target pool of physical storage devices belonging to one of the plurality of storage tiers.

6. The method of claim 5, wherein said first storage tier includes physical storage devices having a first performance classification based on a first set of performance characteristics and being of a first drive technology and wherein the second storage tier includes physical storage devices having a second performance classification based on a second set of performance characteristics and being of a second drive technology different from the first, said first performance classification denoting a higher performance classification than said second performance classification.

7. The method of claim 6, wherein said mapping is performed automatically in accordance with the criteria that further includes any of a workload of said each logical volume, a size of said each logical volume, and capacity of the one or more physical storage devices to which said each logical volume is mapped.

8. The method of claim 7, further comprising:
viewing information regarding performance of a portion of said plurality of logical volumes;
selecting a least one of said portion of logical volumes; and
manually mapping at least the one logical volume to any of a first of the plurality of target storage tiers of physical storage devices and said target pool.

9. The method of claim 7, further comprising viewing information indicating which of the plurality of logical volumes are mapped to any of: one of the plurality of storage tiers and said target pool as a result of automatically performing said mapping.

10. The method of claim 6, wherein simulating the data movement optimization includes simulating a promotion of one data portion of one of the plurality of logical devices, said one data portion being moved from a first physical storage device of the second storage tier to a second physical storage device of the first storage tier.

11. The method of claim 6, wherein simulating the data movement optimization includes simulating a demotion of one data portion of one of the plurality of logical devices, said one data portion being moved from a first physical storage device of the first storage tier to a second physical storage device of the second storage tier.

12. The method of claim 10, wherein the one logical device is a virtually provisioned device having an associated logical address range and physical storage is not allocated for at least a portion of said associated logical address range.

13. The method of claim 1, wherein a total amount of usable storage capacity is specified and creating the target data storage system configuration includes automatically selecting a RAID protection level for at least one of the plurality of storage tiers and determining a number of physical storage devices needed to provide the total amount with the selected RAID protection level.

14. The method of claim 13, wherein creating the target data storage system includes automatically determining a percentage of the total amount of usable storage capacity for each of the plurality of storage tiers including physical storage devices of one of a plurality of performance classifications.

15. The method of claim 1, wherein creating the target data storage system configuration includes manually specifying any of a RAID protection level, a percentage of a total amount of usable storage capacity for each of the plurality of storage tiers including physical storage devices of one of a plurality of performance classifications, and a number of physical storage devices for any of a storage tier and target pool.

16. The method of claim 1, wherein the first activity data includes any of response time, I/O throughput per unit of time, percentage or number of read operations processed in a time period, percentage or number of write operations processed in a time period, read hits, and read misses.

17. The method of claim 1, wherein the first activity data includes activity data that is any of: observed activity data based on actual data storage system performance in connection with servicing I/O operations, activity data obtained through simulation, estimated activity data, second activity data indirectly obtained as a result of translating an initial set of activity data into said second activity data.

18. A non-transitory computer readable medium comprising code stored thereon that, when executed, performs a method of simulating a target data storage system comprising:
- receiving a source configuration including a first logical device;
- receiving first activity data representing workload for the source configuration, said first activity data including I/O workload for a first data portion and a second data portion of the first logical device;
- creating a target data storage system configuration that models a configuration of one or more target data storage systems including a plurality of storage tiers comprising a first storage tier and a second storage tier, said creating including mapping first data portions of the first logical device to at least two storage tiers of the plurality of storage tiers of the target data storage system configuration in accordance with criteria including a data portion workload of each of the first data portions and a first data protection level denoting a specified RAID level for the first logical device, wherein physical devices of each of the at least two storage tiers are configured with a RAID-level that is at least the specified RAID level;
- modeling performance of the target data storage system configuration, said modeling performance including determining a simulated workload for components of the target data storage system configuration based on the first activity data;
- displaying, in a user interface, a utilization map indicating component level utilizations of components of the target data storage system configuration based on the simulated workload;
- simulating a data movement optimization that moves data between two of the plurality of storage tiers within the one or more target data storage systems modeled in accordance with the target data storage system configuration; and
- after performing said simulating the data movement optimization, displaying, in the user interface, a second utilization map indicating updated component level utilizations of the components of the target data storage system configuration which have been revised to model the data movement optimization simulated for the target data storage system configuration.

19. The non-transitory computer readable medium of claim 18, wherein each of said utilization map and said second utilization map provide a visual indication in terms of percentage of utilization for each of said components.

20. The non-transitory computer readable medium of claim 19, wherein said components include at least one front end component port, at least one front end component processor, at least one front end component board, at least one back end component port, at least one back end component processor, at least one back end component board, at least one portion of cache, and a plurality of physical storage devices.

21. The method of claim 1, further comprising:
- viewing information regarding workload of data portions of a logical device; and
- selecting different ones of the data portions of the logical device for placement onto different ones of the plurality of storage tiers, wherein said data portions are selected manually by making one or more user-specified selections with the user interface.

\* \* \* \* \*